US012635204B2

(12) United States Patent
Kim et al.

(10) Patent No.: US 12,635,204 B2
(45) Date of Patent: May 19, 2026

(54) SEMICONDUCTOR DEVICE AND ELECTRONIC DEVICE INCLUDING THE SAME

(71) Applicant: Samsung Electronics Co., Ltd., Suwon-si (KR)

(72) Inventors: Changhyun Kim, Suwon-si (KR); Minsu Seol, Suwon-si (KR); Junyoung Kwon, Suwon-si (KR); Keunwook Shin, Yongin-si (KR); Minseok Yoo, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 393 days.

(21) Appl. No.: 18/331,463

(22) Filed: Jun. 8, 2023

(65) Prior Publication Data

US 2024/0021676 A1      Jan. 18, 2024

(30) Foreign Application Priority Data

Jul. 18, 2022     (KR) ......................... 10-2022-0088551

(51) Int. Cl.
*H01L 29/18*          (2006.01)
*H01L 29/06*          (2006.01)
(Continued)

(52) U.S. Cl.
CPC ........... *H10D 62/84* (2025.01); *H10B 10/125* (2023.02); *H10B 43/27* (2023.02); *H10D 30/43* (2025.01);
(Continued)

(58) Field of Classification Search
CPC .... H10D 62/84; H10D 30/43; H10D 30/6729; H10D 30/6735; H10D 30/6757;
(Continued)

(56) References Cited

U.S. PATENT DOCUMENTS 11,257,923 B2     2/2022  Tsau et al.
2017/0098661 A1*   4/2017  Rakshit ................. H10D 62/80
(Continued)

FOREIGN PATENT DOCUMENTS

JP          2019-106417 A       6/2019
KR          10-2336033 B1      12/2021
(Continued)

OTHER PUBLICATIONS

Koji Kita et al., "Intrinsic Origin of Electric Dipoles Formed at High-k/SiO2 Interface", (Tokyo Univ.) IEDM Tech. Dig (2008).
(Continued)

*Primary Examiner* — Tong-Ho Kim
(74) *Attorney, Agent, or Firm* — HARNESS, DICKEY & PIERCE, P.L.C.

(57) ABSTRACT

A semiconductor device includes a channel including a two-dimensional (2D) semiconductor material, a source electrode and a drain electrode electrically connected to opposite sides of the channel, respectively, a transition metal oxide layer on the channel and including a transition metal oxide, a dielectric layer on the transition metal oxide layer and including a high-k material, and a gate electrode on the dielectric layer.

17 Claims, 14 Drawing Sheets

(51) Int. Cl.

| | |
|---|---|
| *H01L 29/417* | (2006.01) |
| *H01L 29/423* | (2006.01) |
| *H01L 29/775* | (2006.01) |
| *H01L 29/786* | (2006.01) |
| *H10B 10/00* | (2023.01) |
| *H10B 43/27* | (2023.01) |
| *H10D 30/43* | (2025.01) |
| *H10D 30/67* | (2025.01) |
| *H10D 62/10* | (2025.01) |
| *H10D 62/84* | (2025.01) |

(52) U.S. Cl.

CPC ..... *H10D 30/6729* (2025.01); *H10D 30/6735* (2025.01); *H10D 30/6757* (2025.01); *H10D 62/121* (2025.01)

(58) Field of Classification Search

CPC .... H10D 62/121; H10D 30/014; H10D 30/47; H10D 62/80; H10D 64/685; H10D 64/691; H10D 62/82; H10D 64/256; H10D 84/02; H10D 84/85; H10D 30/60; H10D 30/62; H10D 62/10; H10D 62/124; H10D 84/856; H10D 62/235; H10D 64/68; H10D 64/681; H10D 99/00; H10B 10/125; H10B 43/27; H10B 10/12; H10B 41/35; H10B 43/35; B82Y 10/00

USPC ......................................................... 257/288

See application file for complete search history.

(56) References Cited

U.S. PATENT DOCUMENTS

| | | | |
|---|---|---|---|
| 2019/0252554 A1 | 8/2019 | Chen et al. | |
| 2020/0251475 A1 | 8/2020 | Boliek et al. | |
| 2021/0296445 A1* | 9/2021 | Lee ...................... | H10D 64/512 |
| 2021/0408288 A1 | 12/2021 | O'Brien et al. | |
| 2021/0408375 A1 | 12/2021 | Dorow et al. | |
| 2022/0077321 A1 | 3/2022 | Seol et al. | |
| 2022/0140104 A1 | 5/2022 | Heo et al. | |

| | | | |
|---|---|---|---|
| 2022/0199620 A1 | 6/2022 | Thomas et al. | |
| 2022/0199838 A1* | 6/2022 | Dorow ................... | H10D 62/80 |
| 2023/0114933 A1 | 4/2023 | Kim et al. | |

FOREIGN PATENT DOCUMENTS

| | | |
|---|---|---|
| KR | 10-2022-0031366 A | 3/2022 |
| KR | 10-2022-0060446 A | 5/2022 |

OTHER PUBLICATIONS

Sung Heo et al., "Direct evidence of flat band voltage shift for TiN/LaO or ZrO/SiO2 stack structure via work function depth profiling", Scientific Reports, vol. 7, No. 43561, Mar. 2, 2017.

Steven Vitale et al., "Work-Function-Tuned TiN Metal Gate FDSOI Transistors for Subthreshold Operation", ResearchGate, IEEE Transactions on Electron Devices, vol. 58, No. 2, Feb. 2011.

A. Veloso et al., "Advances on doping strategies for triple-gate finFETs and lateral gate-all-around nanowire FETs and their impact on device performance", Materials Science in Semiconductor Processing, vol. 62, 2017.

Extended European Search Report dated Dec. 19, 2023 for corresponding European Application No. 23185775.6.

"Transition Metal", Wikipedia, retrieved on Jun. 12, 2023, XP093109484, URL: https://en.wilipedia.arg/w/index.php?title= Transition_metal&1&oldid=1077236667 <https://url.us.m. mimecastprotect.com/s/RD8fC82o1WtOov8QfnXCzt?domain=en. wilipedia.arg>.

Korean Office Action dated Jan. 25, 2024 for corresponding Korean Application No. 10-2022-0088551, and English-language translation thereof.

Loubet, Nicolas, et al. "Stacked Nanosheet Gate-All-Around Transistor to Enable Scaling Beyond FinFET." 2017 Symposium on VLSI technology. IEEE, 2017.

Bourzac, Katherine. "Nanosheets: IBM's Path to 5-Nanometer Transistors." IEEE Spectrum. Jun. 5, 2017. Available at <URL: https://spectrum.ieee.org/nanosheets-ibms-path-to-5nanometer-transistors>.

Chung, Yun-Yan, et al. "First Demonstration of GAA Monolayer-MoS2 Nanosheet nFET with 410 µA/µm ID at 1V VD at 40nm gate length." 2022 International Electron Devices Meeting (IEDM). IEEE, 2022.

* cited by examiner

<u>600</u>

<u>700</u>

<u>800</u>

SEMICONDUCTOR DEVICE AND ELECTRONIC DEVICE INCLUDING THE SAME

CROSS-REFERENCE TO RELATED APPLICATION

This application is based on and claims priority under 35 U.S.C. § 119 to Korean Patent Application No. 10-2022-0088551, filed on Jul. 18, 2022, in the Korean Intellectual Property Office, the disclosure of which is incorporated by reference herein in its entirety.

BACKGROUND

1. Field

The inventive concepts relate to semiconductor devices and electronic devices including the same.

2. Description of the Related Art

Transistors, which are semiconductor devices for electrical switching, have been adopted in various integrated circuit (IC) devices including memory, a driver IC, a logic device, etc. To improve the integration of an IC device, a space occupied by a transistor included in the IC device has been sharply reduced. As a result, a channel length of the transistor is shortened and a thickness of each layer of the transistor decreases. As such, research has been conducted to maintain desired capabilities while reducing the size of the transistor.

SUMMARY

Some example embodiments of the inventive concepts provide a semiconductor device having a miniaturized and thin channel and a structure capable of representing a desired threshold voltage.

Some example embodiments of the inventive concepts will be set forth in part in the description which follows and, in part, will be apparent from the description, or may be learned by practice of some example embodiments of the inventive concepts.

According to some example embodiments, a semiconductor device includes a channel including a two-dimensional (2D) semiconductor material, a source electrode and a drain electrode electrically connected to opposite sides of the channel, respectively, a transition metal oxide layer on the channel and including a transition metal oxide, a dielectric layer on the transition metal oxide layer and including a high-k material, and a gate electrode on the dielectric layer.

The transition metal oxide layer and the dielectric layer may have different oxygen densities.

The channel may include a transition metal dichalcogenide (TMD) material.

The TMD material may include a metal element selected from Mo, W, Nb, V, Ta, Ti, Zr, Hf, Tc, Re, Cu, Ga, In, Sn, Ge, and Pb, and TMD material may further include a chalcogen element selected from S, Se, and Te.

The transition metal oxide layer may include an oxide of the TMD material included in the channel.

The channel and the transition metal oxide layer may each include an identical transition metal.

The transition metal oxide layer and the channel may be separate portions of a unitary piece of material.

A thickness of the transition metal oxide layer may be equal to or greater than 1 nm and may be less than or equal to 3 nm.

The semiconductor device may further include a substrate supporting the channel, in which the gate electrode surrounds the channel to be spaced apart from the channel, and between the gate electrode and the channel, the transition metal oxide layer surrounds the channel between the gate electrode and the channel and the dielectric layer surrounds the transition metal oxide layer between the gate electrode and the channel.

The channel may include a first channel layer and a second channel layer that are spaced apart from each other in a direction that extends away from the substrate, the transition metal oxide layer may include a first transition metal oxide layer surrounding the first channel layer and a second transition metal oxide layer surrounding the second channel layer, and the dielectric layer may include a first dielectric layer surrounding the first transition metal oxide layer and a second dielectric layer surrounding the second transition metal oxide layer.

The first channel layer and the second channel layer may be configured exhibit different threshold voltages, based on respective materials of the first transition metal oxide layer, the first dielectric layer, the second transition metal oxide layer, and the second dielectric layer.

The semiconductor device may be configured to form a first electric dipole moment on an interfacial surface between the first transition metal oxide layer and the first dielectric layer. The semiconductor device may be configured to form a second electric dipole moment formed on an interfacial surface between the second transition metal oxide layer and the second dielectric layer. The first and second electric dipole moments may have different magnitudes or polarities.

The first channel layer and the second channel layer may include different TMD materials.

The semiconductor device may include a source structure including the source electrode, the source structure connecting the source electrode to the channel, and a drain structure including the drain electrode, the drain structure connecting the drain electrode to the channel, in which the source structure and the drain structure are on the substrate.

Each of the source structure and the drain structure may include a semiconductor region, a silicide film, and a conductive barrier.

A thickness of the channel may be less than or equal to about 3 nm and greater than or equal to about 0.01 nm.

A length of the channel in a direction in which the source electrode and the drain electrode are spaced apart from each other may be less than or equal to about 5 nm and greater than or equal to about 0.01 nm.

The channel may include graphene, black phosphorus, amorphous boron nitride, or phosphorene.

According to some example embodiments, an electronic device includes a substrate and a plurality of semiconductor devices arranged on the substrate. Each semiconductor device of the plurality of semiconductor devices includes a channel including a two-dimensional (2D) semiconductor material, a source electrode and a drain electrode electrically connected to opposite sides of the channel, respectively, a transition metal oxide layer on the channel and including a transition metal oxide, a dielectric layer on the transition metal oxide layer and including a high-k material, and a gate electrode on the dielectric layer, and in which the plurality of semiconductor devices exhibit different threshold voltages.

In each of the plurality of semiconductor devices, the channel may include a plurality of channel layers that are spaced apart from each other in a direction that extends away from the substrate, the transition metal oxide layer may include a plurality of transition metal oxide layers respectively surrounding the plurality of channel layers, and the dielectric layer may include a plurality of dielectric layers respectively surrounding the plurality of transition metal oxide layers.

BRIEF DESCRIPTION OF THE DRAWINGS

The above and other aspects, features, and advantages of certain embodiments of the inventive concepts will be more apparent from the following description taken in conjunction with the accompanying drawings, in which.

DETAILED DESCRIPTION

Figure 1:
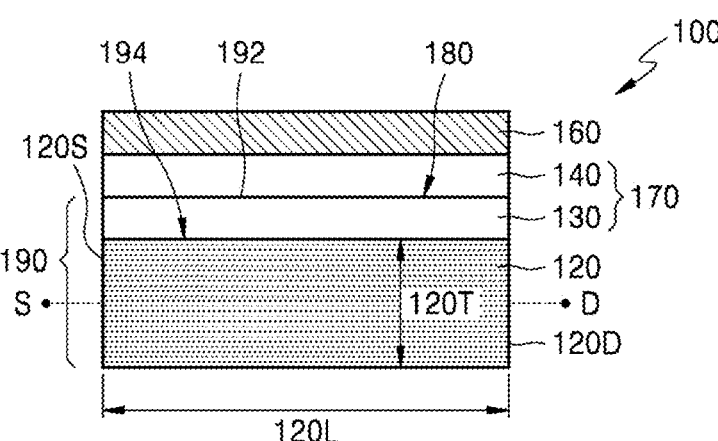
FIG. 1 is a cross-sectional view showing a schematic structure of a semiconductor device according to some example embodiments.

Reference will now be made in detail to example embodiments, some of which are illustrated in the accompanying drawings, wherein like reference numerals refer to like elements throughout. In this regard, some example embodiments may have different forms and should not be construed as being limited to the descriptions set forth herein. Accordingly, some example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, some example embodiments will be described in detail with reference to the accompanying drawings. Example embodiments to be described are merely examples, and various modifications may be made from such example embodiments. In the drawings, like reference numerals denote like components, and sizes of components in the drawings may be exaggerated for convenience of explanation.

An expression such as "above" or "on" may include not only the meaning of "immediately on in a contact manner", but also the meaning of "on in a non-contact manner".

Although the terms "first," "second," etc., may be used herein to describe various components, these terms are used to distinguish one component from other components. These terms do not limit that materials or structures of components are different from one another.

Singular forms include plural forms unless apparently indicated otherwise contextually. When a portion is referred to as "comprises" a component, the portion may not exclude another component but may further include another component unless stated otherwise.

The term used herein such as "unit" or "module" indicates a unit for processing at least one function or operation, and may be implemented in hardware, software, or in a combination of hardware and software.

The use of the terms of "the above-described" and similar indicative terms may correspond to both the singular forms and the plural forms.

It will be understood that when an element is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

While the term "same," "equal" or "identical" may be used in description of some example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

As described herein, when an operation is described to be performed "by" performing additional operations, it will be understood that the operation may be performed "based on" the additional operations, which may include performing said additional operations alone or in combination with other further additional operations.

As described herein, an element that is described to be "spaced apart" from another element, in general and/or in a particular direction (e.g., vertically spaced apart, laterally spaced apart, etc.) and/or described to be "separated from" the other element, may be understood to be isolated from direct contact with the other element, in general and/or in the particular direction (e.g., isolated from direct contact with the other element in a vertical direction, isolated from direct contact with the other element in a lateral or horizontal direction, etc.). Similarly, elements that are described to be "spaced apart" from each other, in general and/or in a particular direction (e.g., vertically spaced apart, laterally spaced apart, etc.) and/or are described to be "separated" from each other, may be understood to be isolated from direct contact with each other, in general and/or in the particular direction (e.g., isolated from direct contact with each other in a vertical direction, isolated from direct contact with each other in a lateral or horizontal direction, etc.).

Also, operations constituting a method may be performed in any suitable order unless it is explicitly stated that they should be performed in an order they are described. Also, the use of all example terms (for example, etc.) is only to describe technical spirit in detail, and the scope of rights is not limited by these terms unless limited by the claims.

FIG. 1 is a cross-sectional view showing a schematic configuration of a semiconductor device according to some example embodiments.

A semiconductor device 100 may include a channel 120, a gate electrode 160 arranged on (e.g., directly or indirectly on) the channel 120, and a transition metal oxide layer 130 and a dielectric layer 140 that are arranged between (e.g., directly or indirectly between) the channel 120 and the gate electrode 160. A side of the channel 120 (e.g., side surface 120S) and a source electrode S may be electrically connected to each other, and the other side (e.g., opposite side surface 120D) of the channel 120 and a drain electrode D may be electrically connected to each other. Accordingly, as shown in FIG. 1, a source electrode S and a drain electrode D may be electrically connected to opposite sides of the channel 120, respectively.

The channel 120 may include a two-dimensional (2D) semiconductor material. The channel 120 may include, for example, a transition metal dichalcogenide (TMD) material, graphene, black phosphorus, amorphous boron nitride, or phosphorene. TMD may include, for example, transition metal of one of Mo, W, Nb, V, Ta, Ti, Zr, Hf, Tc, or Re, and a chalcogen element of one of S, Se, or Te. TMD may be expressed as, for example, $MX_2$, in which M indicates a transition metal and X indicates a chalcogen element. For example, M may be Mo, W, Nb, V, Ta, Ti, Zr, Hf, Tc, Re, etc., and X may be S, Se, Te, etc. Thus, for example, TMD may include $MoS_2$, $MoSe_2$, $MoTe_2$, $WS_2$, $WSe_2$, $Wte_2$, $ZrS_2$, $ZrSe_2$, $HfS_2$, $HfSe_2$, $NbSe_2$, $ReSe_2$, and so forth. In some example embodiments, TMD may not be expressed as $MX_2$. In this case, for example, TMD may include CuS that is a compound of a transition metal, Cu, and a chalcogen element, S. Meanwhile, TMD may be a chalcogenide material including non-transition metal. The non-transition metal may include, for example, Ga, In, Sn, Ge, Pb, etc. In this case, TMD may include a compound of non-transition metal, such as Ga, In, Sn, Ge, Pb, etc., and a chalcogenide element, such as S, Se, or Te. For example, TMD may include $SnSe_2$, GaS, GaSe, GaTe, GeSe, $In_2Se_3$, $InSnS_2$, etc.

As such, TMD may include a metal element selected from Mo, W, Nb, V, Ta, Ti, Zr, Hf, Tc, Re, Cu, Ga, In, Sn, Ge, and Pb, and a chalcogen element selected from S, Se, and Te. However, the aforementioned materials are examples, and other materials may be used as a TMD material.

A two-dimensional semiconductor material may be doped with a p-type dopant or an n-type dopant to adjust mobility. Herein, as the p-type dopant and the n-type dopant, a p-type dopant and an n-type dopant used for graphene, a carbon nanotube (CNT), etc., may be used. The p-type dopant or the n-type dopant may be doped by ion implantation or chemical doping.

The gate electrode 160 may include a metal material or a conductive oxide. The metal material may include, for example, at least one selected from Au, Ti, TiN, TaN, W, Mo, WN, Pt, and/or Ni. The conductive oxide may include, for example, indium tin oxide (ITO), indium zinc oxide (IZO), etc. The gate electrode 160 may include polysilicon or single crystal silicon. The gate electrode 160 may include the same material as the source electrode S and the drain electrode D.

By using a 2D semiconductor material for the channel 120, a short channel length 120L may be implemented when the semiconductor device 100 is applied as a field effect transistor. A channel length 120L indicates a length of the channel 120 in a direction in which the source electrode S and the drain electrode D are spaced apart from each other (e.g., a length of the channel 120 between opposite side surfaces 120S and 120D of the channel 120 which are respectively connected to separate electrodes of the source electrode S and the drain electrode D, where the channel length 120L extends in a direction, which may be referred to herein as a horizontal direction, that is perpendicular or substantially perpendicular to one or both of the opposite side surfaces 120S and 120D of the channel 120). In line with a recent trend toward miniaturization of electronic devices, a channel length 120L has been decreased. As the channel length 120L decreases, problems may be caused by a short channel effect. To reduce or prevent the problem and effectively reduce the channel length 120L, it is preferable that the thickness 120T of the channel 120 is thin, where the thickness 120T may be a thickness of the channel 120 in a direction orthogonal to the direction in which the channel lengths 120L extends, such that the thickness 120T is a thickness of the channel 120 in a direction, which may be referred to herein as a vertical direction, that is parallel or substantially parallel to one or both of the opposite side surfaces 120S and 120D of the channel 120. That is, as the thickness 120T of the channel 120 decreases, a minimum channel length 120L that can be implemented may be set short. For example, the minimum channel length 120L of a channel 120 may be proportional to the thickness 120T of the channel 120.

The 2D semiconductor material included in the channel 120 may have an excellent electrical property and can maintain high mobility without a large change in characteristics thereof even when the thickness thereof decreases to a nanoscale. The 2D semiconductor material may have a monolayer or multilayer structure. Each layer of the 2D semiconductor material may have a thickness in an atomic level. The thickness 120T of the channel 120 may be about 10 nm or less, about 5 nm or less, or about 3 nm or less and may be greater than 0 nm, about 0.01 nm or more, about 0.1 nm or more, about 0.5 nm or more, about 1 nm or more, or the like. The thickness 120T of the channel 120 is not limited thereto, and may become thinner. The length 120L of the channel 120, i.e., the length of the channel 120 in a direction in which the source electrode S and the drain electrode D are spaced apart from each other and thus a direction extending perpendicular or substantially perpendicular to one or both of the opposite side surfaces 120S and/or 120D, may be about 5 nm or less and may be greater than 0 nm, about 0.01 nm or more, about 0.1 nm or more, about 0.5 nm or more, about 1 nm or more, or the like. In some example embodiments, the length of the channel 120 may be about 4 nm or less or about 3 nm or less and may be greater than 0 nm, about 0.01 nm or more, about 0.1 nm or more, about 0.5 nm or more, about 1 nm or more, or the like. However, this is merely an example, and the inventive concepts are not limited thereto. As the thickness 120T of the channel 120 decreases, the length 120L of the channel 120 may be shortened.

When a 2D semiconductor material is applied to (e.g., included in) the channel 120, it is difficult to form a gate insulating film between the channel 120 and the gate electrode 160. For example, a TMD material is a 2D material including a van der Waals bond, and has an advantage that it can have a stable structure without a dangling bond where three atoms form one layer, but a dielectric material is difficult to deposit on the TMD material due to absence of the dangling bond.

The semiconductor device 100 according to some example embodiments may use, as the gate insulating film 170, a transition metal oxide layer 130 and a dielectric layer 140 including a high-k material.

The transition metal oxide layer 130 may include a transition metal oxide. The transition metal oxide may include at least any one of a Ti oxide, a Ta oxide, an Ni oxide, a Zn oxide, a W oxide, a Co oxide, an Nb oxide, a TiNi oxide, an LiNi oxide, an InZn oxide, a V oxide, an SrZr oxide, an SrTi oxide, a Cr oxide, a Fe oxide, a Cu oxide, an Hf oxide, a Zr oxide, an Al oxide, or any combination thereof. The transition metal oxide layer 130 may include, for example, $MoO_3$ and $WO_3$.

When the channel 120 includes the TMD material, the transition metal oxide layer 130 may be an oxide of the TMD material included in the channel 120. In this case, a transition metal included in the TMD material included in the channel 120 and a transition metal included in the transition metal oxide layer 130 may be the same as each other (e.g., an identical transition metal), such that the channel 120 and the transition metal oxide layer 130 each include an identical transition metal. In some example embodiments, the channel 120 and the transition metal oxide layer 130 may be separate portions of a single, unitary piece of material 190, such that channel 120 and transition metal oxide layer 130 are not separate pieces of material having opposing, connected surfaces at interface 194 therebetween, where the channel 120 and the transition metal oxide layer 130 may be defined as separate portions of the unitary piece of material having separate material compositions that are the TMD material and the oxide of the TMD material, respectively, and where interface 194 may be a location, plane, etc. in the unitary piece of material 190 where a material composition of the unitary piece of material 190 changes from being more of the TMD material than the oxide of the TMD material (e.g., the channel 120) to being more of the oxide of the TMD material than the TMD material or equal amounts thereof (e.g., the transition metal oxide layer 130) and where interface is defined by the change in material composition and is not an interface between opposing surfaces of separate pieces of material. In some example embodiments, interface 194 may be a location, plane, etc. in the unitary piece of material 190 having equal amounts, of the TMD material and the oxide of the TMD material. In some example embodiments, the change of material composition between the channel 120 and the transition metal oxide layer 130 in the unitary piece of material 190 may be gradual, or continuous, in the thickness direction extending parallel or substantially parallel to thickness 120T, instead of being a discontinuous change of material composition in the thickness direction. In some example embodiments, the channel 120 and the transition metal oxide layer 130 may be separate portions of a single, unitary piece of material 190 based on the transition metal oxide layer 130 being formed due to oxidation the TMD material of an outer portion, including an exposed surface (e.g., upper surface) of the unitary piece of material 190 based on depositing the dielectric layer 140 on an outer surface 192 of the unitary piece of material 190, such that the TMD material of the outer portion of the unitary piece of material that includes at least the outer surface 192 is oxidized to form the transition metal oxide layer 130 such that the exposed outer surface 192 becomes a surface of the transition metal oxide layer 130 that at least partially defines the interfacial surface 180 between the transition metal oxide layer 130 and the dielectric layer 140.

The thickness of the transition metal oxide layer 130 may be about 1 nm or more and about 3 nm or less. The thickness of the transition metal oxide layer 130 may be a thickness corresponding to a monolayer of a 2D material included in the channel 120 or in a similar range. However, the inventive concepts are not limited thereto.

The dielectric layer 140 may include a high-k material. The dielectric layer 140 and the transition metal oxide layer 130 may include different materials and thus may have different total material compositions. The dielectric layer 140 may include metal A and oxygen, and may be a metal oxide expressed as $A_xO_y$, where A may be a metal which may be one of Al, La, Ti, Zr, Hf, Mg, Ge, Y, Lu, or Sr, and x and y may each independently be any positive integer (e.g., 0, 1, 2, or any integer greater than 2). The dielectric layer 140 may include, for example, an oxide of Al, La, Ti, Zr, Hf, Mg, Ge, Y, Lu, or Sr. As shown in FIG. 1, the transition metal oxide layer 130 may be between (e.g., directly between or indirectly between) the dielectric layer 140 and the channel 120, but example embodiments are not limited thereto. In some example embodiments, the dielectric layer 140 may be between (e.g., directly between or indirectly between) the transition metal oxide layer 130 and the channel 120.

The transition metal oxide layer 130 and the dielectric layer 140 may have different oxygen densities, for example based on the different material compositions thereof. The transition metal oxide layer 130 and the dielectric layer 140 may have, for example, different areal oxygen densities. The areal oxygen density refers to the number of oxygen atoms that are present per unit area (e.g., per unit area of one or more surfaces of the transition metal oxide layer 130 and/or the dielectric layer 140, for example one or more interfacial surfaces thereof). A difference between areal oxygen densities may cause a structural imbalance on an interfacial surface between the transition metal oxide layer 130 and the dielectric layer 140. Such a structural imbalance may be addressed through movement of oxygen atoms. That is, the oxygen atoms move from a layer having the higher areal oxygen density at a surface of the layer to another layer having the lower areal oxygen density at an opposing surface of the other layer, between the transition metal oxide layer 130 and the dielectric layer 140. The moving oxygen atom is in the form of an $O^{2-}$ anion. Movement of the oxygen atoms causes oxygen vacancy in the layer having the higher areal oxygen density between the transition metal oxide layer 130 and the dielectric layer 140, and causes excess oxygen in the layer having the lower areal oxygen density. Thus, the layer having the lower areal oxygen density between the two layers is negatively charged and the layer having the higher areal oxygen density is positively charged. Thus, an electric dipole in a direction from negative charges to positive charges may be generated on an interfacial surface 180 between the transition metal oxide layer 130 and the dielectric layer 140. Such an electric dipole moment may raise or lower a Fermi energy level $E_f$ of the dielectric layer 140, such that a work function of the gate electrode 160 located on the dielectric layer 140 may change. A change in the work function of the gate electrode 160 may have an influence upon a threshold voltage of the channel 120.

Figures 2A, 2B:
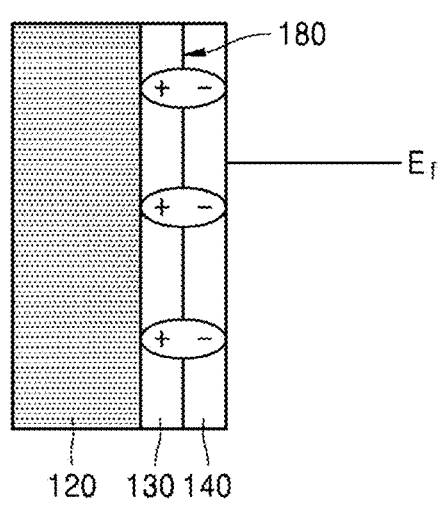
FIGS. 2A and 2B are conceptual views of an electric dipole moment formed on interfacial surfaces of gate insulating films included in the semiconductor device of FIG. 1 according to some example embodiments.

FIGS. 2A and 2B are conceptual views of an electric dipole moment formed on interfacial surfaces of gate insulating films included in the semiconductor device of FIG. 1 according to some example embodiments.

In FIG. 2A, the areal oxygen density of the dielectric layer 140 is higher than that of the transition metal oxide layer 130, in which the anion oxygen atoms may move from the dielectric layer 140 to the transition metal oxide layer 130. As a result, oxygen vacancy may be formed in the dielectric layer 140, and the transition metal oxide layer 130 enters an excess oxygen state. Thus, an electric dipole may be generated in a direction from negative charges to positive charges, i.e., in a direction from the transition metal oxide layer 130 to the dielectric layer 140, on the interfacial surface 180 between the transition metal oxide layer 130 and the dielectric layer 140. The dielectric layer 140 may have the Fermi energy level $E_f$ corresponding thereto.

In FIG. 2B, in contrast to FIG. 2A, the areal oxygen density of the transition metal oxide layer 130 is higher than that of the dielectric layer 140, in which the anion oxygen atoms may move from the transition metal oxide layer 130 to the dielectric layer 140. Thus, electric dipole may be generated in a direction from negative charges to positive charges, i.e., in a direction from the dielectric layer 140 to the transition metal oxide layer 130, on the interfacial surface 180 between the transition metal oxide layer 130 and the dielectric layer 140. The dielectric layer 140 in FIG. 2B may have the corresponding Fermi energy level $E_f$ that may be higher than the Fermi energy level $E_f$ shown in FIG. 2A.

The change in the Fermi energy level $E_f$ shown in FIGS. 2A and 2B is an example. Due to the areal oxygen density of the transition metal oxide layer 130, the areal oxygen density of the dielectric layer 140, a difference between the areal oxygen density of the transition metal oxide layer 130 and the areal oxygen density of the dielectric layer 140, etc., a magnitude and a direction of an electric dipole moment generated on the interfacial surface 180 between the transition metal oxide layer 130 and the dielectric layer 140 may be adjusted variously. Thus, the Fermi energy level $E_f$ of the dielectric layer 140 may be adjusted, and a work function of the gate electrode 160 located on the dielectric layer 140 may be adjusted, which may improve performance of the semiconductor device 100 based on enabling the semiconductor device 100 to maintain particular operational capabilities (e.g., based on enabling the Fermi energy level $E_f$ of the dielectric layer 140 to be adjusted, the work function of the gate electrode 160 located on the dielectric layer 140 to be adjusted, enabling the threshold voltage of the channel 120 to be adjusted to a desired value or magnitude, etc.) while the channel length 120L and the channel thickness 120T both are decreased based on including both the transition metal oxide layer 130 and the dielectric layer 140 between the channel 120 and the gate electrode 160 in the semiconductor device 100, thereby enabling improved miniaturization with reduced or prevented reduction in semiconductor device 100 performance. For example, based on the semiconductor device 100 including the transition metal oxide layer 130 in addition to the dielectric layer 140 between the channel 120 and the gate electrode 160, the threshold voltage of the channel 120 may be adjusted to compensate for reduced channel length 120L and thickness 120T based on the electric dipole moment that may be configured to be formed between the transition metal oxide layer 130 and the dielectric layer 140, thereby enabling miniaturization of the semiconductor device 100 (e.g., reduced length 120L and thickness 120T) with reduced or prevented decrease in semiconductor device 100 performance as a result of said miniaturization.

Figure 3:
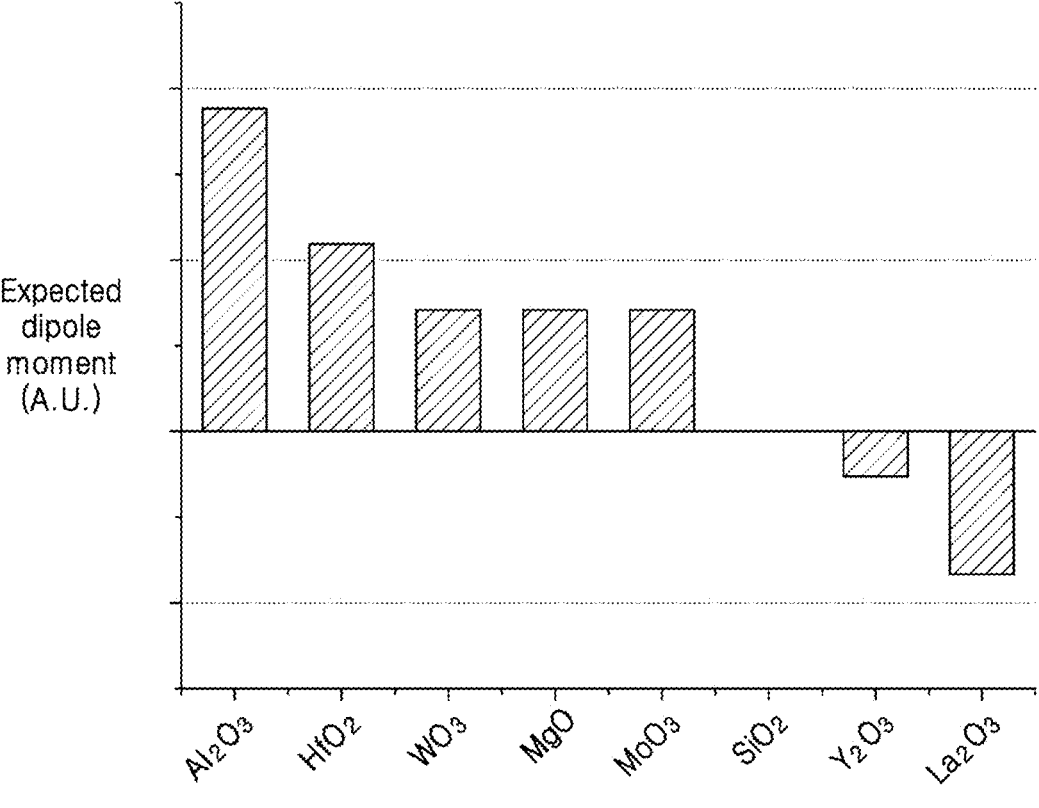
FIG. 3 illustrates oxygen densities of various materials applicable to the gate insulating films of the semiconductor device of FIG. 1 according to some example embodiments.

FIG. 3 illustrates oxygen densities of various materials applicable to the gate insulating films of the semiconductor device of FIG. 1 according to some example embodiments.

The shown materials may include a transition metal oxide that may be used in the transition metal oxide layer 130 and high-k dielectric materials that may be employed in the dielectric layer 140. A material combination that is appropriate for a threshold voltage to be implemented by the semiconductor device 100 may be selected and applied to the gate insulating film.

As described above, the semiconductor device 100 shown in FIG. 1 may use the transition metal oxide layer 130 and the dielectric layer 140 as the gate insulating film to adjust the work function of the gate electrode 160, and may be applied as a field effect transistor showing a desired threshold voltage. The semiconductor device 100 may show various threshold voltages, such that the semiconductor device 100 may be applied as a device that implements a multi-threshold voltage easy for logic design.

Although the semiconductor device 100 of FIG. 1 is illustrated in a form having the channel 120 in a flat form, the inventive concepts are not limited thereto and the semiconductor device 100 may be applied as a fin-shaped field-effect transistor (FinFET), a gate-all-around FET (GAAFET), a multi-bridge channel FET (MBCFET), etc., having a three-dimensional (3D) channel structure.

Hereinbelow, a semiconductor device and electronic devices according to some example embodiments will be described.

Figure 4:
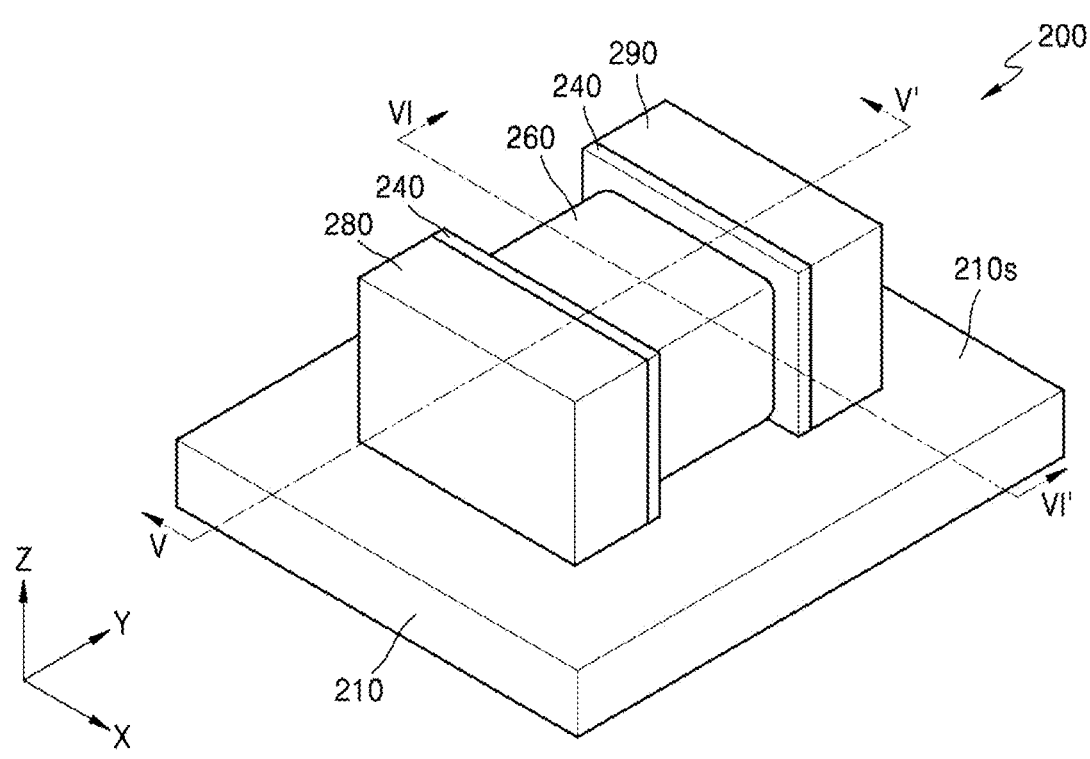
FIG. 4 is a perspective view showing a schematic structure of a semiconductor device according to some example embodiments.
Figure 5:
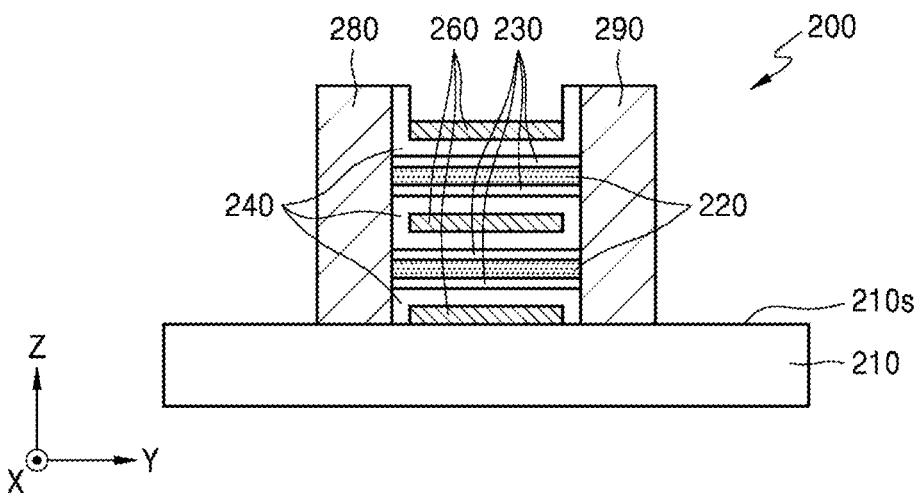
FIG. 5 is a cross-sectional view taken along cross-sectional view line V-V' of FIG. 4 according to some example embodiments.
Figure 6:
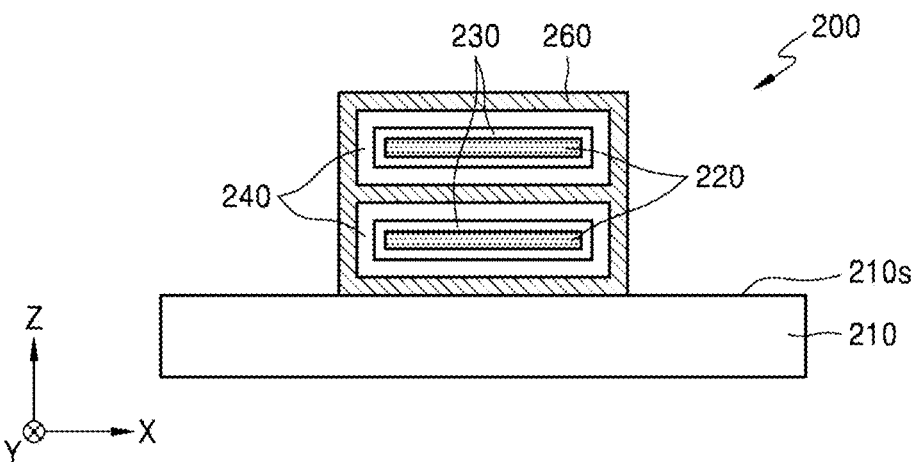
FIG. 6 is a cross-sectional view taken along cross-sectional view line VI-VI' of FIG. 4 according to some example embodiments.

FIG. 4 is a perspective view showing a schematic structure of a semiconductor device according to some example embodiments, FIG. 5 is a cross-sectional view taken along cross-sectional view line V-V' of FIG. 4 according to some example embodiments, and FIG. 6 is a cross-sectional view taken along cross-sectional view line VI-VI' of FIG. 4 according to some example embodiments.

Referring to the drawings, a semiconductor device 200 may include a plurality of channel layers 220 arranged on (e.g., directly or indirectly on an upper surface 210s of) a substrate 210, a source electrode 280 and a drain electrode 290 that are electrically connected to the channel layer 220, and a gate electrode 260 arranged apart (e.g., spaced apart) from the channel layer 220.

The substrate 210 may be an insulating substrate, or a semiconductor substrate having an insulating layer formed on a surface thereof. The semiconductor substrate may include, for example, Si, Ge, SiGe, a group III-V semiconductor material, etc. The substrate 210 may be, for example, a silicon substrate having a silicon oxide formed on a surface thereof, without being limited thereto.

On (e.g., directly or indirectly on) the substrate 210, the source electrode 280 and the drain electrode 290 may be arranged apart from each other in a first direction (a direction Y, which may be a direction extending parallel or substantially parallel to an upper surface 210s of the substrate 210 and/or a direction extending between the source electrode 280 and the drain electrode 290), and the plurality of channel layers 220 may be arranged apart (e.g., spaced apart) from each other in a direction (a direction Z) away from the substrate 210 (e.g., a direction extending perpendicular or substantially perpendicular to an upper surface 210s of the substrate 210) between the source electrode 280 and the drain electrode 290. The gate electrode 260 may be arranged to surround each of the plurality of channel layers 220 in a position spaced apart from the channel layer 220.

A plurality of transition metal oxide layers 230 and a plurality of dielectric layers 240 may be located between the gate electrode 260 and the plurality of channel layers 220. The plurality of transition metal oxide layers 230 may be arranged in a form respectively surrounding separate, respective channel layers 220 of the plurality of channel layers 220, and the plurality of dielectric layers 240 may be arranged in a form respectively surrounding separate, respective transition metal oxide layers 230 of the plurality of transition metal oxide layers 230.

As materials of the channel layer 220, the transition metal oxide layer 230, the dielectric layer 240, the gate electrode 260, the source electrode 280, and the drain electrode 290, materials described as examples in the channel 120, the transition metal oxide layer 130, the dielectric layer 140, the gate electrode 160, the source electrode S, and the drain electrode D described with reference to FIG. 1 may be used.

As shown in FIGS. 5 and 6, the transition metal oxide layer 230 and the dielectric layer 240 may each have a shape surrounding the channel layer 220 with an axis parallel to the first direction (the direction Y) as a center axis. The entire area of the channel layer 220 except for an area contacting the source electrode 280 and the drain electrode 290 (e.g., the entire outer surface of a channel layer 220 that is exposed from the source electrode 280 and the drain electrode 290) may contact the transition metal oxide layer 230. The dielectric layer 240 may have a shape surrounding the transition metal oxide layer 230 with an axis parallel to the first direction (the direction Y) as a center axis, and the outer surface of a transition metal oxide layer 230 that is exposed from the source electrode 280 and the drain electrode 290 may contact the dielectric layer 240. The dielectric layer 240 may extend along side surfaces of the source electrode 280 and the drain electrode 290 (e.g., may extend the entirety of the distance between and may contact opposing surfaces of the source electrode 280 and the drain electrode 290) for insulation between the gate electrode 260 and the source electrode 280 and between the gate electrode 260 and the drain electrode 290, as shown in FIG. 5.

The semiconductor device 200 according to some example embodiments may be a field effect transistor in a form of a multi-bridge channel. This form may reduce a short channel effect and may be favorable to high integration, as stated above. Moreover, a uniform source/drain junction capacitance may be maintained regardless of a channel position, such that the semiconductor device 200 of this form may be used as a high-speed and high-reliability device. Although the semiconductor device 200 is shown as including two channel layers 220, this is merely an example, without the inventive concepts being limited thereto. Moreover, contact of each of the plurality of channel layers 220 with the source electrode 280 and the drain electrode 290 is shown in an edge contact form, but the inventive concepts are not limited thereto, such that the contact may be changed into a planar contact form. The forms of the source electrode 280 and the drain electrode 290 may be changed into other forms favorable to contact with the channel layer 220.

Figure 7:
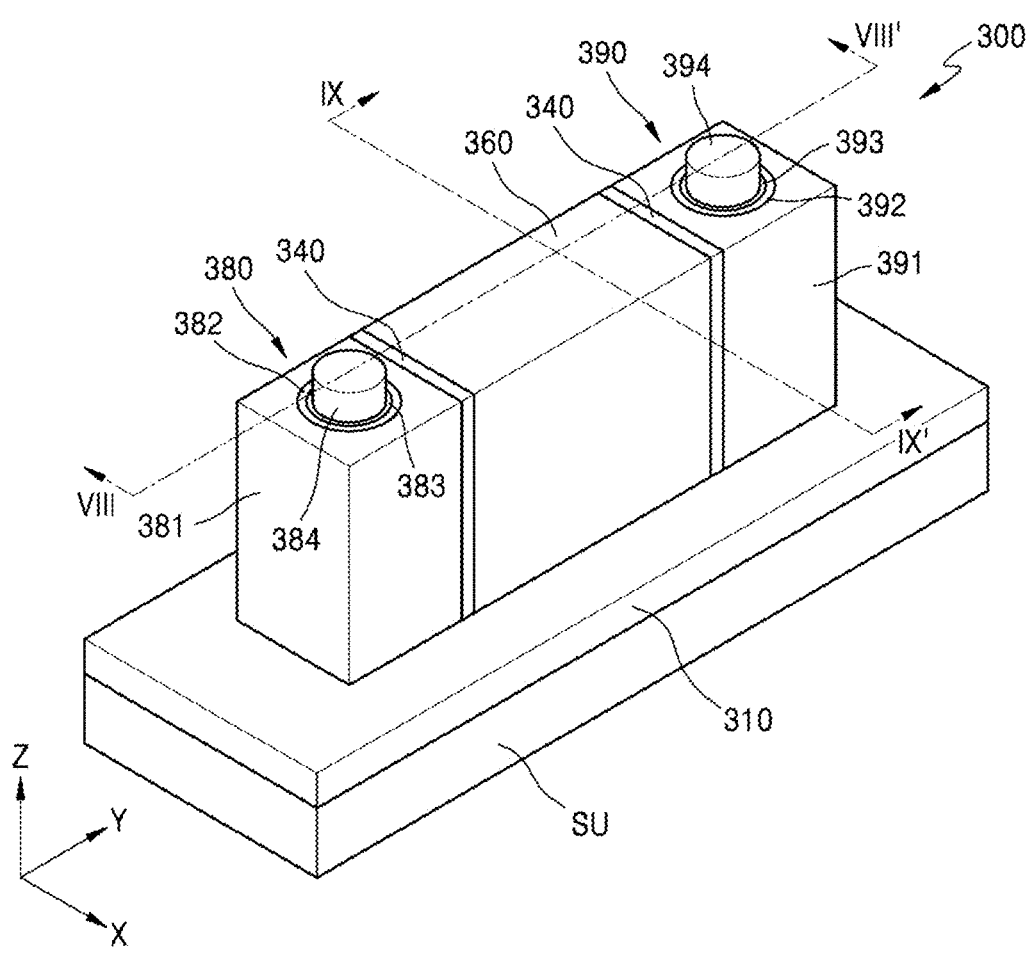
FIG. 7 is a perspective view showing a schematic structure of a semiconductor device according to some example embodiments.
Figure 8:
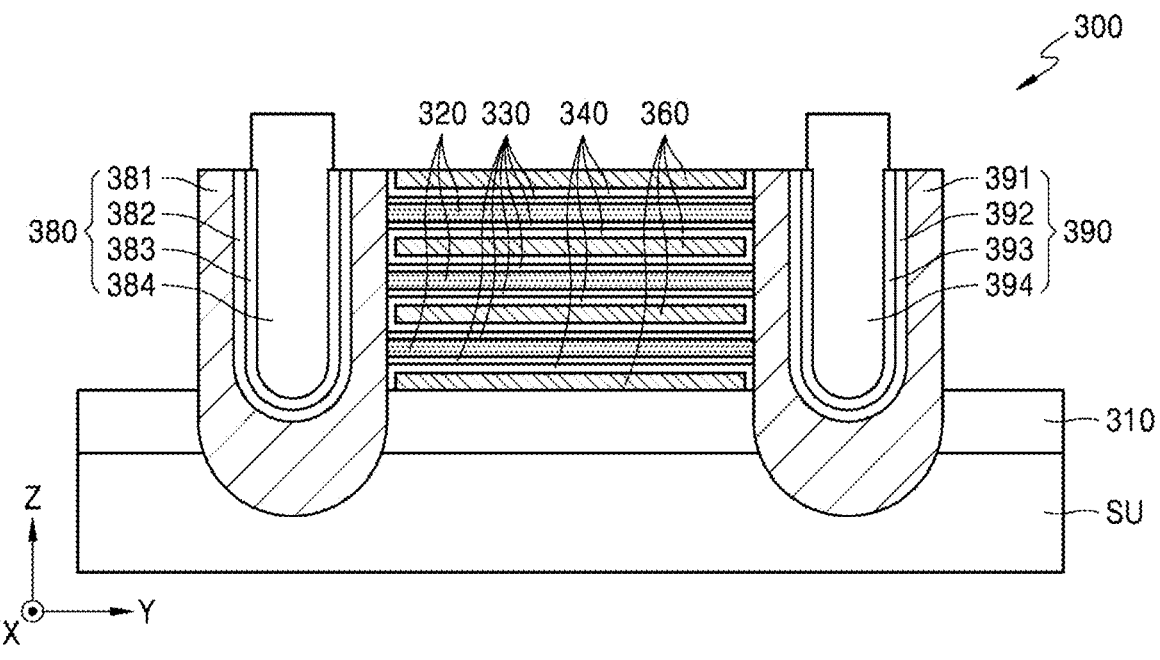
FIG. 8 is a cross-sectional view taken along cross-sectional view line VIII-VIII' of FIG. 7 according to some example embodiments.

FIG. 7 is a perspective view showing a schematic structure of a semiconductor device according to some example embodiments. FIG. 8 is a cross-sectional view taken along cross-sectional view line VIII-VIII' of FIG. 7 according to some example embodiments, and FIG. 9 is a cross-sectional view taken along cross-sectional view line IX-IX' of FIG. 7 according to some example embodiments.

Figure 9:
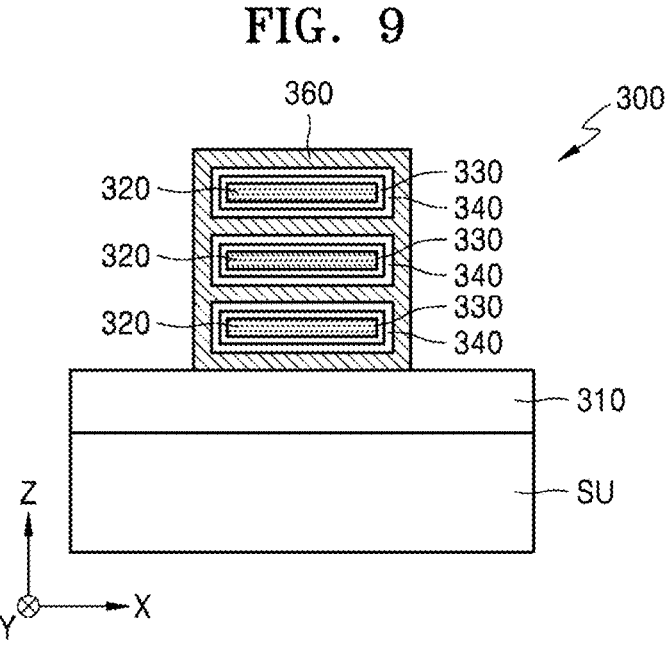
FIG. 9 is a cross-sectional view taken along cross-sectional view line IX-IX' of FIG. 7 according to some example embodiments.

A semiconductor device 300 according to some example embodiments, including the example embodiments shown in FIGS. 7 to 9, is similar with the semiconductor device 200 described with reference to FIGS. 4 to 6 in a sense that the semiconductor device 300 is a field effect transistor in the multi-bridge channel form, but they are different from each other in terms of detailed shapes of a source structure and a drain structure, and thus differences will be mainly described.

The semiconductor device 300 may include a substrate SU, a plurality of channel layers 320 arranged on the substrate SU, a gate electrode 360 that is spaced apart from each of the plurality of channel layers 320 and surrounds each of the plurality of channel layers 320, and a plurality of transition metal oxide layers 330 and a plurality of dielectric layers 340 that surround the plurality of channel layers 320 between the gate electrode 360 and the plurality of channel layers 320. On (e.g., directly or indirectly on) the substrate SU, an insulating layer 310 serving as a device separating film may be arranged.

On (e.g., directly or indirectly on) the substrate SU, a source structure 380 including a source electrode 384 electrically connected to ends of the plurality of channel layers 320 and a drain structure 390 including a drain electrode 394 electrically connected to the other ends (e.g., opposite ends) of the plurality of channel layers 320 may be formed.

The source structure 380 may include a semiconductor region 381, a silicide film 382, a conductive barrier 383, and a source electrode 384. The source electrode 384 may include a first portion surrounded by the semiconductor region 381 and a second portion protruding above the semiconductor region 381. The first portion of the source electrode 384 may be sequentially surrounded by the conductive barrier 383, the silicide film 382, and the semiconductor region 381.

Like the source structure 380, the drain structure 390 may include a semiconductor region 391, a silicide film 392, a conductive barrier 393, and a drain electrode 394. The drain electrode 394 may include a first portion surrounded by the semiconductor region 391 and a second portion protruding above the semiconductor region 391. The first portion of the drain electrode 394 may be sequentially surrounded by the conductive barrier 393, the silicide film 392, and the semiconductor region 391.

The semiconductor regions 381 and 391 may be arranged to protrude from a top surface of the substrate SU in the direction Z. The semiconductor regions 381 and 391 may contact the substrate SU via the insulating layer 310. The semiconductor regions 381 and 391 may include an n-type semiconductor doped at a high concentration or a p-type semiconductor doped at a relatively high concentration. The semiconductor regions 381 and 391 may include, for example, SiGe, but the inventive concepts are not limited thereto. A part of the semiconductor regions 381 and 391 may be connected to the plurality of channel layers 320, and another part of the semiconductor regions 381 and 391 may have a width greater than or equal to a width of the channel layer 320 in the direction X.

The conductive barrier 383 may be arranged between the silicide film 382 and the source electrode 384 to prevent gas or metal from spreading to the silicide film 382, or reduce such spreading. For example, the conductive barrier 383 may prevent a gas material used in deposition of the source electrode 384 from reacting with the silicide film 382 in contact with the silicide film 382, or reduce such reaction, and prevent a metal material of the conductive barrier 383 from spreading to the silicide film 382, or reduce such spreading.

The conductive barrier 393 of the drain structure 390 is also used for a function similar to the conductive barrier 383 of the source structure 380.

The conductive barriers 383 and 393 may include a material that is not easily damaged due to physical or chemical stability thereof. To maintain the resistances of the source structure 380 and the drain structure 390 low, the conductive barriers 383 and 393 may include a material having electrically superior conductivity.

The conductive barriers 383 and 393 may include a conductive 2D material, such as graphene. In addition to the graphene, various 2D materials having conductivity may be used. For example, the 2D material used as the conductive barriers 383 and 393 may include at least one selected from graphene, black phosphorus, amorphous boron nitride (BN), 2D hexagonal system (h) BN, and phosphorene. When the 2D material is used, the thickness of the conductive barriers 383 and 393 may decrease, thus improving the performance of the semiconductor device 300 while further reducing the size of the semiconductor device 300. For example, the thickness of the conductive barriers 383 and 393 may be in a range of about 0.3 nm to about 2 nm.

The source electrode 384 and the drain electrode 394 may include, for example, at least one metal selected from W, Co, Cu, Ru, Mo, Rh, Ir, and an alloy thereof. In some example embodiments, the source electrode 384 and the drain electrode 394 may respectively include the same conductive 2D material as the conductive barriers 383 and 393. In this case, the source electrode 384 and the conductive barrier 383 may be formed integrally (e.g., as separate portions of a single, unitary piece of material), and the drain electrode 394 and the conductive barrier 393 may be formed integrally.

Figure 10:
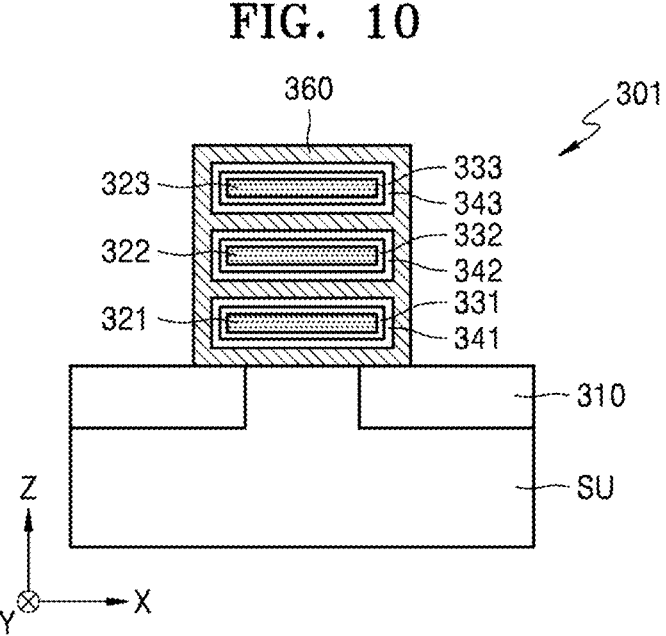
FIG. 10 is a cross-sectional view showing a schematic structure of a semiconductor device according to some example embodiments.

FIG. 10 is a cross-sectional view showing a schematic structure of a semiconductor device according to some example embodiments.

A semiconductor device 301 according to some example embodiments, including the example embodiments shown in FIG. 10, may be different from the semiconductor device 300 described with reference to FIG. 9 in that the plurality of channel layers 320 in different layers may be different, the plurality of transition metal oxide layers 330 may be different, and/or the plurality of dielectric layers 340 may be different.

That is, the semiconductor device 301 may include a first channel layer 321, a second channel layer 322, and a third channel layer 323, include a first transition metal oxide layer 331 and a first dielectric layer 341 that sequentially surround the first channel layer 321, include a second transition metal oxide layer 332 and a second dielectric layer 342 sequentially surrounding the second channel layer 322, and include a third transition metal oxide layer 333 and a third dielectric layer 343 sequentially surrounding the third channel layer 323.

Gate insulating films, i.e., materials of the first transition metal oxide layer 331, the first dielectric layer 341, the second transition metal oxide layer 332, the second dielectric layer 342, the third transition metal oxide layer 333, and the third dielectric layer 343 may be set such that at least two of the first channel layer 321, the second channel layer 322, or the third channel layer 323 exhibit different threshold voltages. For example, at least two of the first channel layer 321, the second channel layer 322, or the third channel layer 323 may be configured to exhibit different threshold voltages based on the respective materials of the first transition metal oxide layer 331, the first dielectric layer 341, the second transition metal oxide layer 332, the second dielectric layer 342, the third transition metal oxide layer 333, and the third dielectric layer 343.

For example, an electric dipole moment formed on (e.g., formed at) an interfacial surface between the first transition metal oxide layer 331 and the first dielectric layer 341 (e.g., a first electric dipole moment) and an electric dipole moment formed on an interfacial surface between the second transition metal oxide layer 332 and the second dielectric layer 342 (e.g., a second electric dipole moment) may have different magnitudes or polarities (e.g., the first and second electric dipole moments may have different magnitudes or polarities) such that the first channel layer 321 and the second channel layer 322 exhibit different threshold voltages. To this end, a material combination of a gate insulating film formed around each of the first channel layer 321 and the second channel layer 322 may be different. For example, a material combination of the respective materials comprising the first channel layer 321, the first transition metal oxide layer 331, and the first dielectric layer 341, may include different materials than are included in a material combination of the respective materials comprising the second channel layer 322, the second transition metal oxide layer 332, and the second dielectric layer 342.

The material combination of the gate insulating film, which makes (e.g., defines, determines, etc.) threshold voltages of at least two of the first channel layer 321, the second channel layer 322, and the third channel layer 323 different may be various ones. For example, two of the first dielectric layer 341, the second dielectric layer 342, and the third dielectric layer 343 may include different high-k materials. In some example embodiments, the first dielectric layer 341, the second dielectric layer 342, and the third dielectric layer 343 may include the same high-k material, and two of the first dielectric layer 341, the second dielectric layer 342, and the third dielectric layer 343 may include different transition metal oxides. To this end, two of the first dielectric layer 341, the second dielectric layer 342, and the third dielectric layer 343 may include different TMD materials. Together with such material selection, the thickness of the gate insulating films may be properly set.

Figure 11:
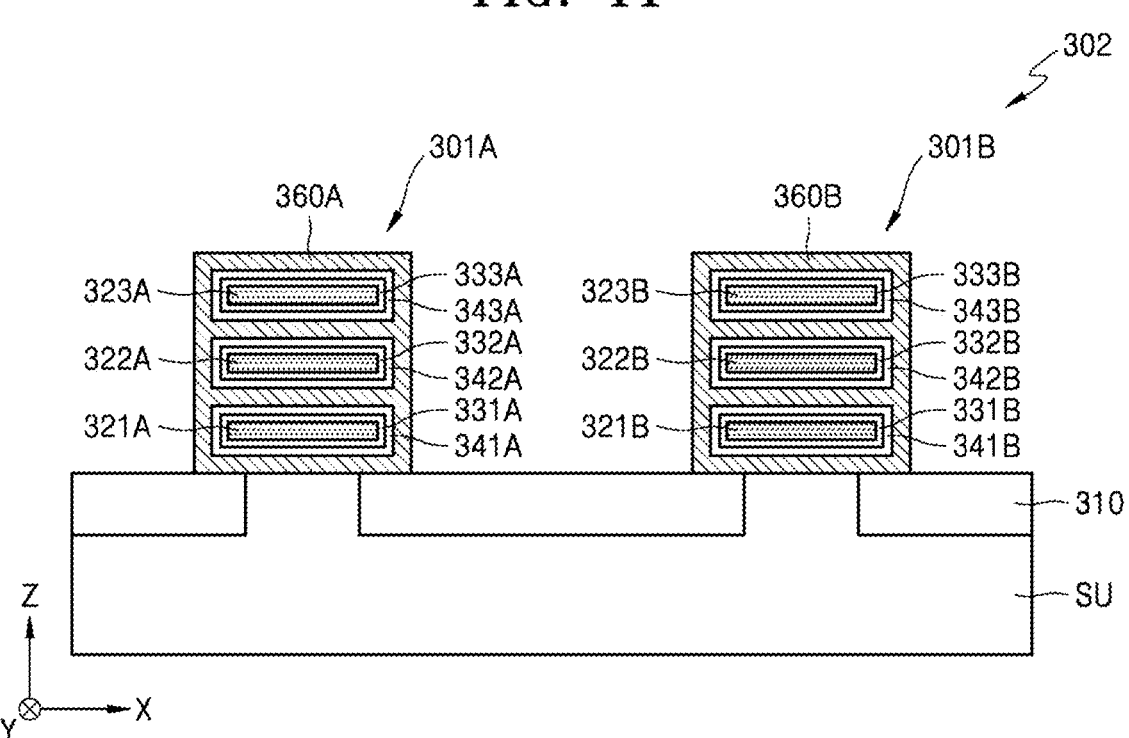
FIG. 11 is a cross-sectional view showing a schematic configuration of a semiconductor device according to some example embodiments.

FIG. 11 is a cross-sectional view showing a schematic configuration of an electronic device according to some example embodiments of the inventive concepts.

An electronic device 302 may include a first semiconductor device 301A and a second semiconductor device 301B.

The first semiconductor device 301A may include a first channel layer 321A, a second channel layer 322A, and a third channel layer 323A, include a first transition metal oxide layer 331A and a first dielectric layer 341A sequentially surrounding the first channel layer 321A, include a second transition metal oxide layer 332A and a second dielectric layer 342A sequentially surrounding the second channel layer 322A, and include a third transition metal oxide layer 333A and a third dielectric layer 343A sequentially surrounding the third channel layer 323A and may include a first gate electrode 360A surrounding the first to third dielectric layers 341A to 343A.

The second semiconductor device 301B may include a first channel layer 321B, a second channel layer 322B, and a third channel layer 323B, include a first transition metal oxide layer 331B and a first dielectric layer 341B sequentially surrounding the first channel layer 321B, include a second transition metal oxide layer 332B and a second dielectric layer 342B sequentially surrounding the second channel layer 322B, and include a third transition metal oxide layer 333B and a third dielectric layer 343B sequentially surrounding the third channel layer 323B and may include a second gate electrode 360B surrounding the first to third dielectric layers 341B to 343B.

A threshold voltage of the first semiconductor device 301A and a threshold voltage of the second semiconductor device 301B may be different from each other. A combination of gate insulating films included in each of the first semiconductor device 301A and the second semiconductor device 301B may be different such that the threshold voltage of the first semiconductor device 301A and a threshold voltage of the second semiconductor device 301B may be different from each other.

The first semiconductor device 301A and the second semiconductor device 301B may be independently the same as any one of the semiconductor devices 300 or 301 described above.

The electronic device 302 is illustrated as including two semiconductor devices having different threshold voltages, but the inventive concepts is not limited thereto such that the electronic device 302 may include three or more semiconductor devices having different threshold voltages.

FIGS. 12A, 12B, 12C, 12D, 12E, and 12F are views of a method of manufacturing a semiconductor device, according to some example embodiments.

Figure 12A:
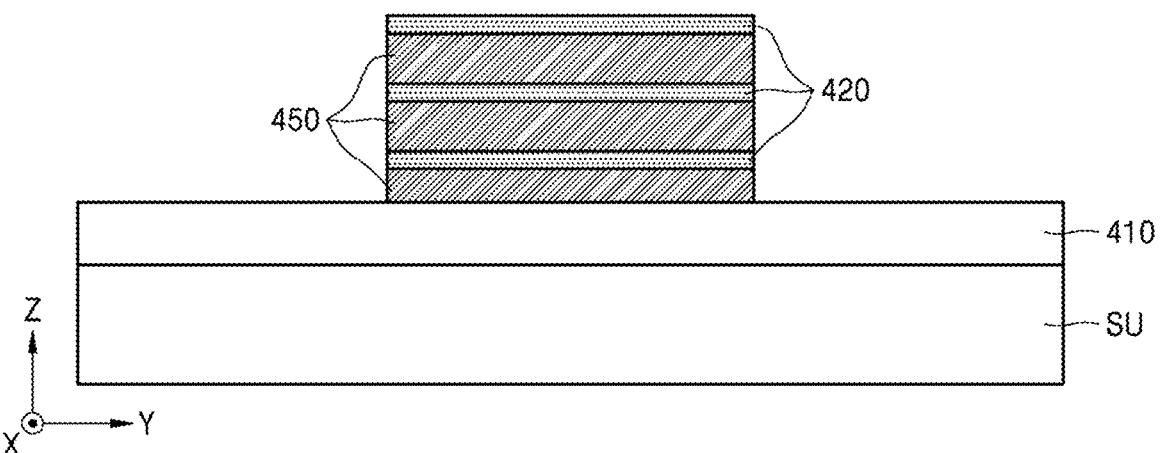
FIGS. 12A, 12B, 12C, 12D, 12E, and 12F are views of a method of manufacturing a semiconductor device, according to some example embodiments.

Referring to FIG. 12A, a dummy layer 450 and a channel layer 420 may be repeatedly deposited for several times on the substrate SU. An insulating layer 410 serving as a device separating film may be formed on the substrate SU, and as shown, a plurality of dummy layers 450 and a plurality of channel layers 420 may be alternately deposited on the insulating layer 410.

The dummy layer 450 supports the plurality of channel layers 420 formed spaced apart from each other and is a sacrificial layer to be removed after another structure supporting the channel layer 420 is formed. The dummy layer 450 may support the channel layer 420 and may include a material having an etching rate different from that of the channel layer 420 so as to be selectively removed. The dummy layer 450 may be formed using chemical vapor deposition (CVD), etc. The dummy layer 450 may include SiGe.

The channel layer 420 may include a 2D semiconductor material, and the channel layer 420 may include various channel 120 materials described with reference to FIG. 1. The channel layer 420 may be formed using, for example, metal organic CVD (MOCVD), atomic layer deposition (ALD), etc. The channel layer 420 may have a single layer or multi-layer structure including a 2D semiconductor material. The thickness of the channel layer 420 may be about 10 nm or less, about 5 nm or less, about 3 nm or less, or about 1 nm or less. The channel layer 420 may have a three-layer structure of a TMD material. For example, the channel layer 420 may include, but not limited to, a trilayer of $MoS_2$.

The channel layer 420 may be formed of a 2D semiconductor material doped with a conductive dopant. The 2D semiconductor material of the channel layer 420 may be doped with a p-type dopant or an n-type dopant. Herein, as the p-type dopant and the n-type dopant, a p-type dopant and an n-type dopant used for graphene, a CNT, etc., may be used. The p-type dopant or the n-type dopant may be doped by ion implantation or chemical doping.

A source of the p-type dopant may include, for example, ionic liquid, such as $NO_2BF_4$, $NOBF_4$, $NO_2SbF_6$, etc., an acidic compound, such as HCl, $H_2PO_4$, $CH_3COOH$, $H_2SO_4$, $HNO_3$, etc., an organic compound, such as dichlorodicyanoquinone (DDQ), oxone, dimyristoylphosphatidylinositol (DMPI), trifluoromethanesulfoneimide, etc. In some example embodiments, the source of the p-type dopant may include, for example, $HPtCl_4$, $AuCl_3$, $HauCl_4$, AgOTf (silver trifluoromethanesulfonate), $AgNO_3$, $H_2PdCl_6$, $Pd(Oac)_2$, $Cu(CN)_2$, or the like.

The source of the n-type dopant may include, for example, a reduction product of a substituted or unsubstituted nicotinamide, a reduction product of a compound which is chemically bound to a substituted or unsubstituted nicotinamide, and a compound including at least two pyridinium moieties in which a nitrogen atom of at least one of the pyridinium moieties is reduced. For example, the source of the n-type dopant may include nicotinamide mononucleotide-H (NMNH), nicotinamide adenine dinucleotide-H (NADH), nicotinamide adenine dinucleotide phosphate-H (NADPH), or viologen. In some example embodiments, the source of the n-type dopant may include polymer, such as polyethylenimine (PEI), etc. In some example embodiments, the n-type dopant may include alkali metal, such as K, Li, etc. Meanwhile, the materials described above of the p-type dopant and the n-type dopant are examples, and various other materials may be used as dopants.

A structure where the dummy layer 450 and the channel layer 420 are alternately deposited may be formed on an entire surface of the substrate SU and then patterned by photolithography, thus having desired X-direction width and Y-direction width.

In FIG. 12A, the plurality of channel layers 420 are not limited to including the same material. When necessary, some of the plurality of channel layers 420 may include different 2D materials and include TMD materials of different types.

Figure 12B:
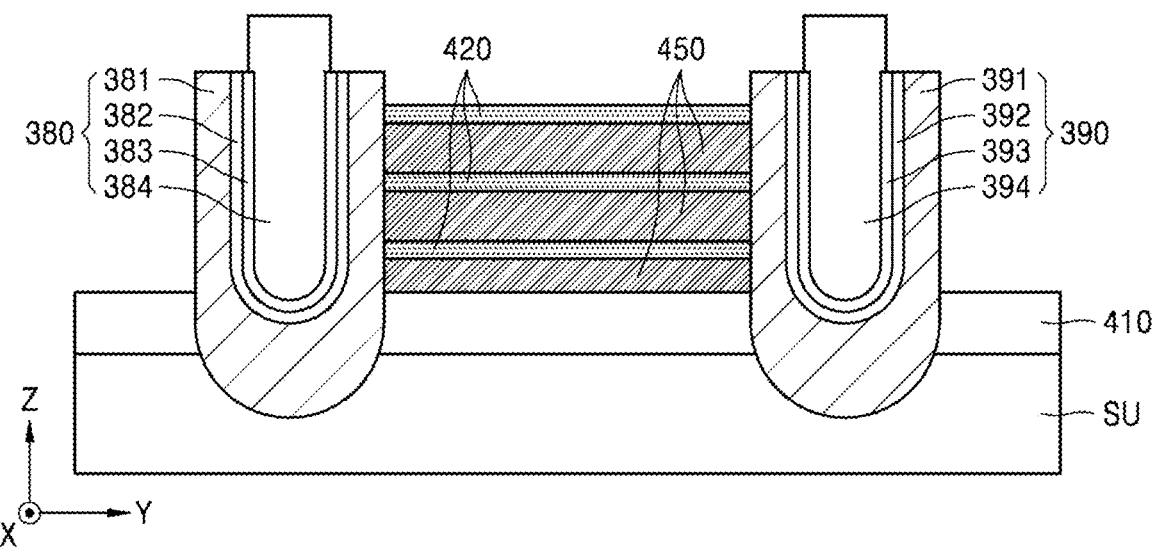

Referring to FIG. 12B, a source structure 380 and a drain structure 390 may be formed which contact both ends (e.g., opposite ends, opposite sides, opposite side surfaces, etc.) of each channel layer 420 of the plurality of channel layers 420. The source structure 380 and the drain structure 390 may have a detailed structure shown in FIG. 8.

Figure 12C:
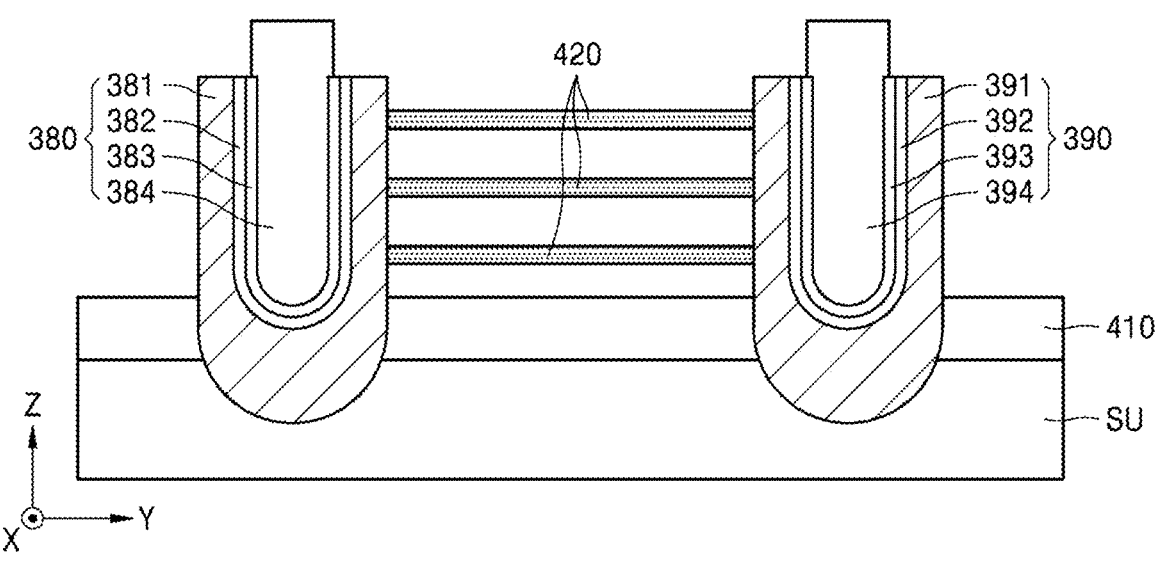

Next, as shown in FIG. 12C, the dummy layer 450 may be removed such that a structure may be formed where the plurality of channel layers 420 are supported in the form of a bridge between the source structure 380 and the drain structure 390. To remove the dummy layer 450, an etching gas for selectively etching the dummy layer 450 may be used.

Figure 12D:
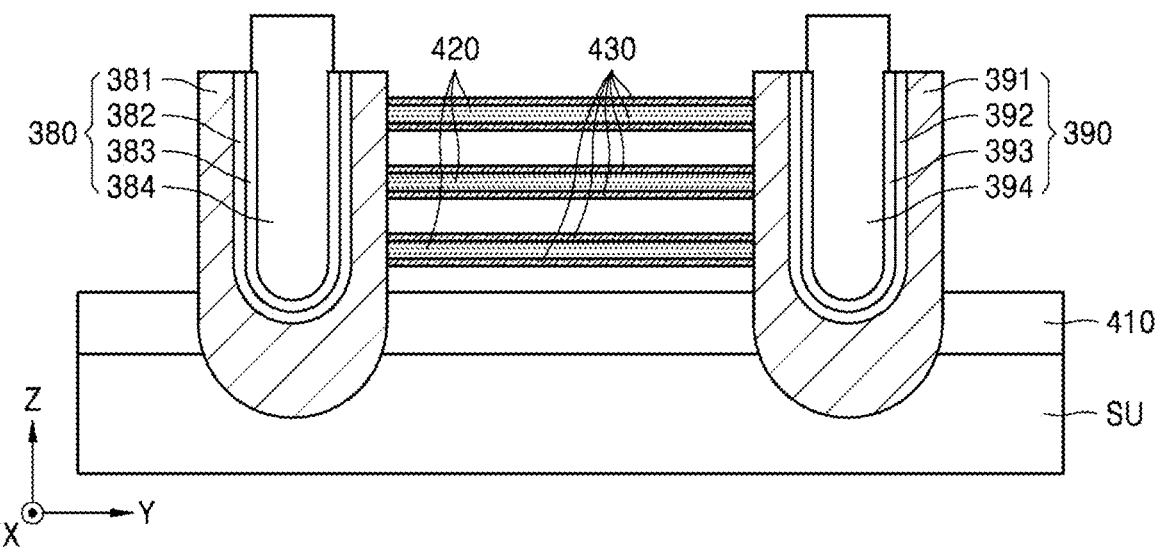

Next, as shown in FIG. 12D, a process for oxidizing the channel layer 420 may be performed. Oxidation may use thermal treatment or oxygen plasma processing in an oxygen atmosphere. A part of the surface of the channel layer 420 may be oxidized to form a transition metal oxide layer 430. In some example embodiments, the transition metal oxide layer 430 may thus be formed based on oxidation of a part, for example an outer and exposed portion of the channel layer 420 (e.g., an exposed surface of the channel layer 420) such that the channel layer 420 and the transition metal oxide layer 430 are respective inner and outer (e.g., exposed) portions of a single, unitary piece of material, where the separate portions of the unitary piece of material which define the respective channel layer 420 and transition metal oxide layer 430 are defined based on the transition metal oxide layer 430 including an oxide of the transition metal comprising the channel layer 420, for example, the transition metal oxide layer 430 being the portion of the unitary piece of material that includes more of the oxide of the transition metal than the transition metal or equal amounts thereof and the channel layer 420 being the portion of the unitary piece of material that includes more of the transition metal than the oxide of the transition metal. The interface defining the boundary between the transition metal oxide layer 430 and the channel layer 420 in a unitary piece of material may be a boundary, location, plane, curve, etc. in the unitary piece of material characterized by having equal amounts of the transition metal and the oxide of the transition metal. Processing conditions, i.e., temperature and time may be set considering the thickness of the transition metal oxide layer 430.

Processing of FIG. 12D may be omitted. This is because in a process of forming a dielectric layer 440, to be described with reference to FIG. 12E, a feature where the surface of the channel layer 420 is oxidized may be used. Whether processing of FIG. 12D is performed or not may be selected based on details such as a processing condition to be described with reference to FIG. 12E, the thickness of the transition metal oxide layer 430 to be formed, the material of the channel layer 420, etc.

Figure 12E:
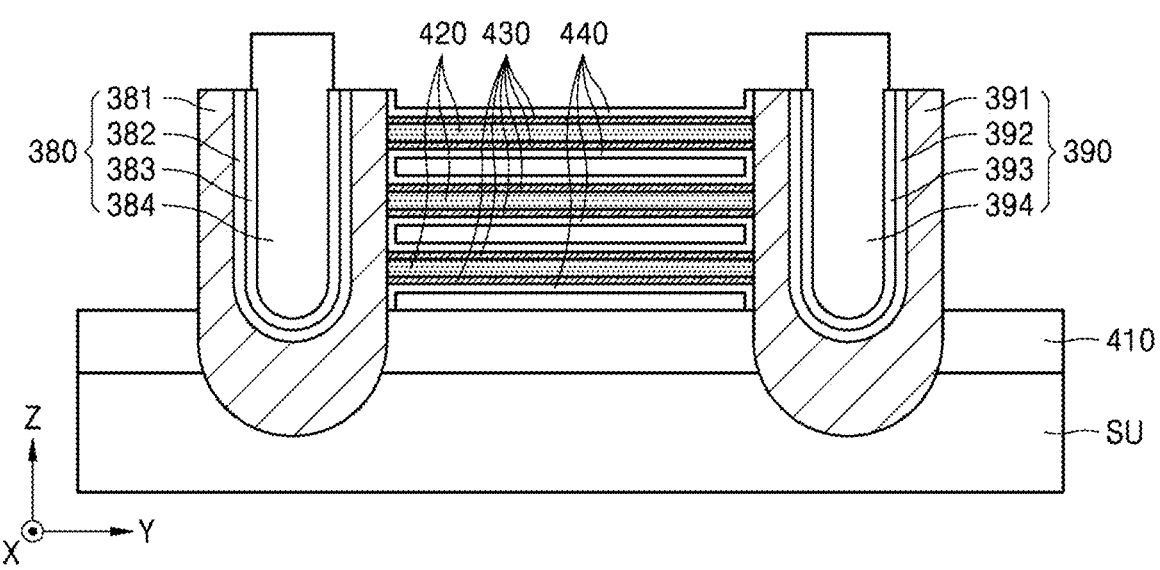

Next, as shown in FIG. 12E, the dielectric layer 440 may be formed on the transition metal oxide layer 430. The dielectric layer 440 may include a high-k material. The dielectric layer 440 may be formed to surround the transition metal oxide layer 430. The dielectric layer 440 may be formed to extend to the surfaces of the source structure 380 and the drain structure 390. To form the dielectric layer 440, for example, CVD, ALD, physical vapor deposition (PVD), etc., may be used. In some example embodiments, for example where the processing of FIG. 12D is omitted, a transition metal oxide layer 430 may be formed between a dielectric layer 440 and a channel layer 420 based on the process of forming the dielectric layer 440 on the channel layer 420. For example, in some example embodiments the processing at FIG. 12E includes forming a dielectric layer 440 on one or more exposed surfaces (e.g., one or more exposed outer surfaces) of a channel layer 420, where the forming of the dielectric layer 440 on the exposed outer surface(s) of the channel layer 420 causes oxidation of at least an outer portion of the channel layer 420 which includes the exposed outer surface(s) of the channel layer 420 such that the channel layer 420 and the transition metal oxide layer 430 are respective inner and outer portions of a single, unitary (e.g., continuous) piece of material and where the dielectric layer 440 is a separate layer on the single unitary piece of material, where the separate portions of the unitary piece of material which define the respective channel layer 420 and transition metal oxide layer 430 are defined based on the transition metal oxide layer 430 including more of an oxide of the transition metal comprising the channel layer 420 than of the transition metal itself. It may be understood that the "transition metal" as described herein as being in the channel layer or channel, and distinguished from the oxide of the transition metal, may refer to the non-oxidized transition metal.

Figure 12F:
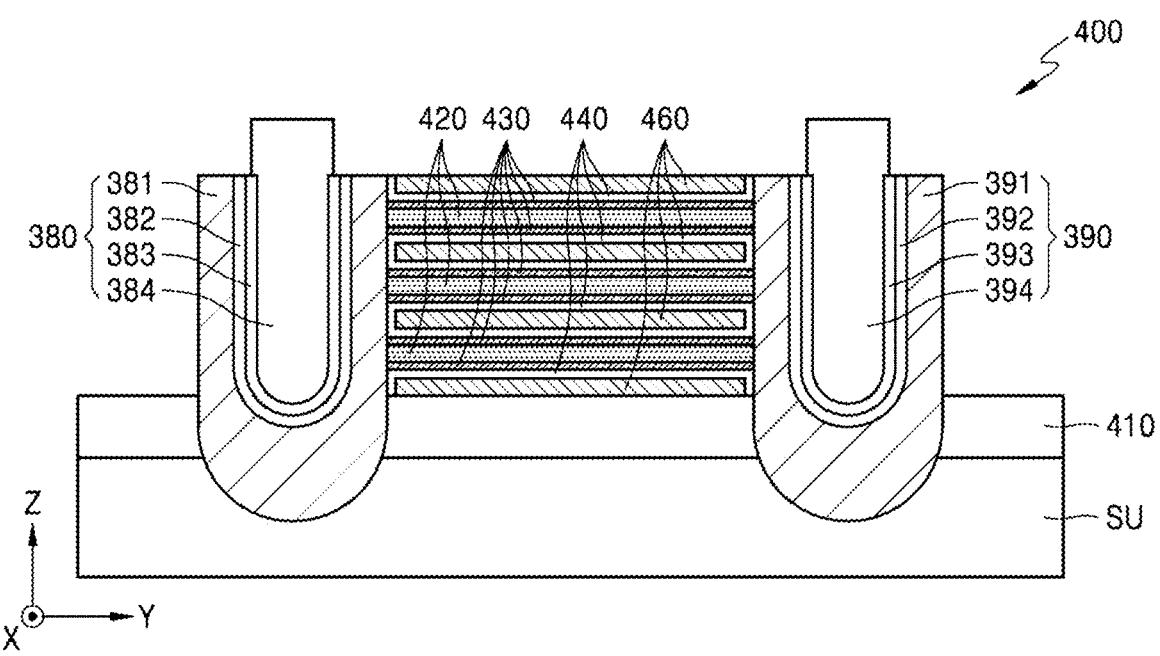

Next, a gate electrode 460 may be formed by depositing an electrode material on the dielectric layer 440, as shown in FIG. 12F. The gate electrode 460 may be formed to surround the channel layer 420, the transition metal oxide layer 430, and the dielectric layer 440, similarly to that shown in FIG. 9 that is a cross-sectional view in a direction different from that of FIG. 12F.

A manufacturing method described with reference to FIGS. 12A to 12F is an example, such that other various methods for forming the semiconductor devices 100, 200, 300, 301, and 400 described above may be used without being limited to the example.

The semiconductor devices 100, 200, 300, 301, and 400 described above may be used for, for example, a driver integrated circuit (IC), a complementary metal-oxide semiconductor (CMOS) inverter, CMOS static random access memory (SRAM) device, a CMOS NAND circuit of a display, and/or other various electronic devices.

Figure 13:
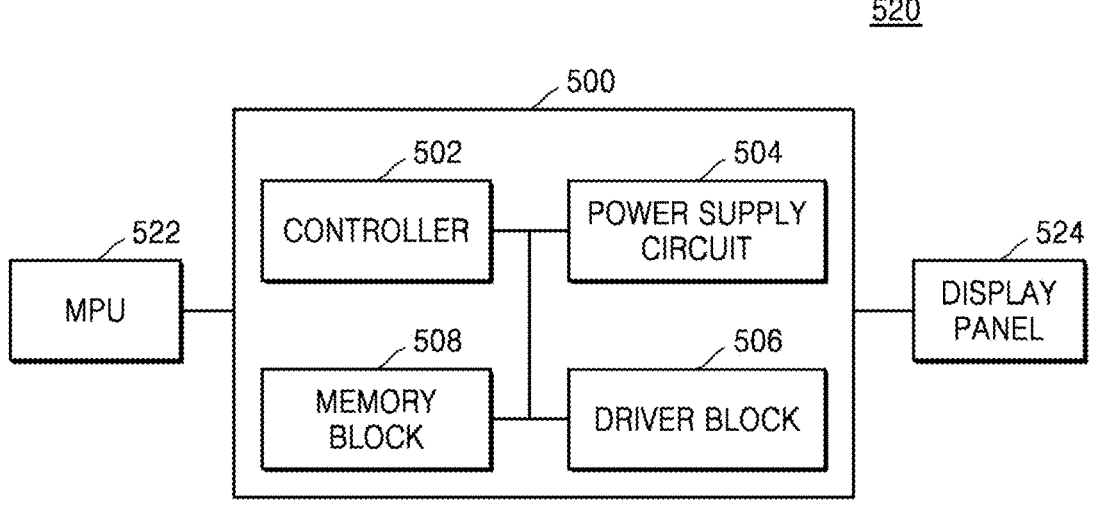
FIG. 13 is a schematic block diagram of a display driver integrated circuit (DDI) and a display device including the DDI, according to some example embodiments.

FIG. 13 is a schematic block diagram of a display driver IC (DDI) and a display device including the DDI, according to some example embodiments.

Referring to FIG. 13, an electronic device 520 may include a display DDI 500, a main processing unit (MPU) 522, and a display panel 524. The display DDI 500 may include a controller 502, a power supply circuit 504, a driver block 506, and a memory block 508. The controller 502 may receive and decode a command applied from the MPU 522, and control each block of the DDI 500 to implement an operation corresponding to the command. The power supply circuit 504 may generate a driving voltage in response to control of the controller 502. The driver block 506 may drive a display panel 524 by using the driving voltage generated in the power supply circuit 504 in response to control of the controller 502. The display panel 524 may be, for example, a liquid crystal display panel, an organic light-emitting device (OLED) display panel, or a plasma display panel. The memory block 508 may temporarily store a command input to the controller 502 or control signals output from the controller 502 or store required data, and may include memory, such as random access memory (RAM), read only memory (ROM), etc. The power supply circuit 504 and the driver block 506 may include any one of the semiconductor devices 100, 200, 300, 301, or 400 according to some example embodiments described in detail with reference to FIGS. 1 to 12F, or a semiconductor device in which they are modified and combined.

Figures 14, 15:
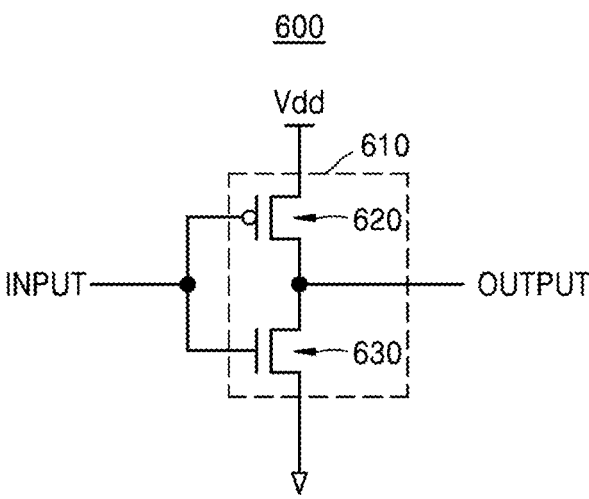
FIG. 14 is a circuit diagram of a complementary metal-oxide semiconductor (CMOS) inverter according to some example embodiments.
FIG. 15 is a circuit diagram of a CMOS static random access memory (SRAM) device according to some example embodiments.

FIG. 14 is a circuit diagram of a CMOS inverter according to some example embodiments.

Referring to FIG. 14, a CMOS inverter 600 may include a CMOS transistor 610. The CMOS transistor 610 may include a PMOS transistor 620 and an NMOS transistor 630 that are connected between a power terminal Vdd and a ground terminal. The CMOS transistor 610 may include any one of the semiconductor devices 100, 200, 300, 301, or 400 according to some example embodiments described in detail with reference to FIGS. 1 to 12F, or a semiconductor device in which they are modified and combined.

FIG. 15 is a circuit diagram of a CMOS SRAM device 700 according to some example embodiments.

Referring to FIG. 15, the CMOS SRAM device 700 may include a pair of driving transistors 710. The pair of driving transistors 710 may include a PMOS transistor 720 and an NMOS transistor 730 that are connected between a power terminal Vdd and a ground terminal. The CMOS SRAM device 700 may further include a pair of transmission transistors 740. A source of the transmission transistor 740 may be cross-connected to a common node of the PMOS transistor 720 and the NMOS transistor 730 of the driving transistor 710. The power terminal Vdd may be connected to a source of the PMOS transistor 720, and the ground terminal may be connected to a source of the NMOS transistor 730. A word line WL may be connected to gates of the pair of transmission transistors 740, and a bit line BL and an inverted bit line may be respectively connected to drains of the pair of transmission transistors 740. At least one of the driving transistor 710 or the transmission transistor 740 of the CMOS SRAM device 700 may include any one of the semiconductor devices 100, 200, 300, 301, or 400 according to some example embodiments described in detail with reference to FIGS. 1 to 12F or a semiconductor device in which they are modified and combined.

Figure 16:
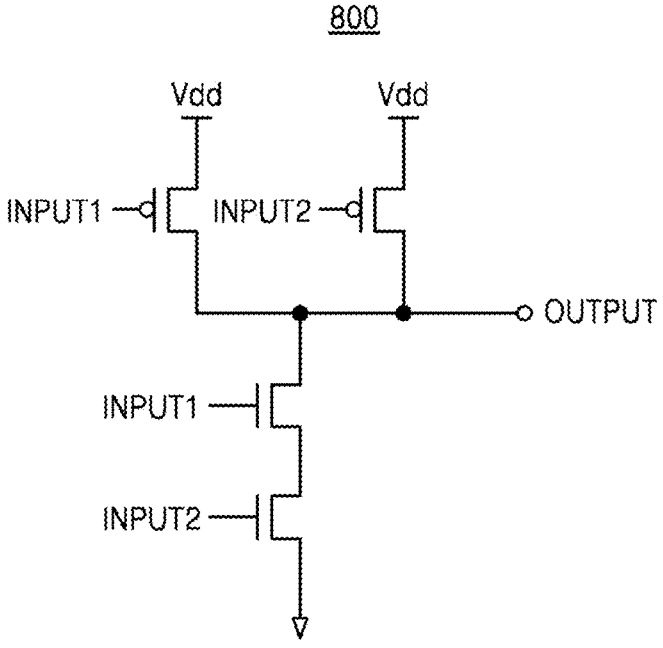
FIG. 16 is a circuit diagram of a CMOS NAND circuit according to some example embodiments.

FIG. 16 is a circuit diagram of a CMOS NAND circuit according to some example embodiments.

Referring to FIG. 16, a CMOS NAND circuit 800 may include a pair of CMOS transistors to which different input signals are transmitted. The CMOS NAND circuit 800 may include a semiconductor device according to some example embodiments described in detail with reference to FIGS. 1 to 12F.

Figure 17:
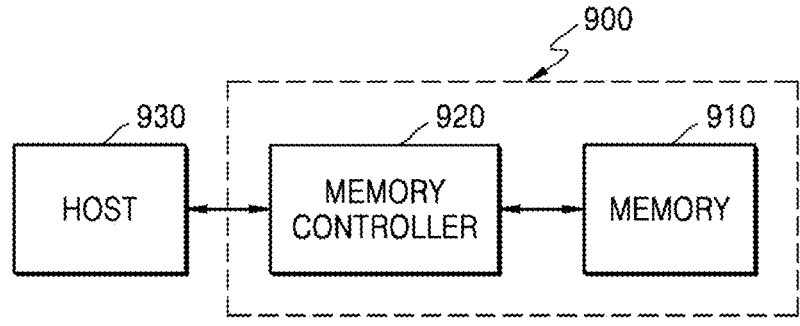
FIG. 17 is a block diagram of an electronic device according to some example embodiments.

FIG. 17 is a block diagram of an electronic device according to some example embodiments.

Referring to FIG. 17, an electronic device 900 may include a memory 910 and a memory controller 920. The memory controller 920 may control the memory 910 for data reading from the memory 910 and/or data writing to the memory 910, in response to a request of a host 930. At least one of the memory 910 or the memory controller 920 may include any one of the semiconductor devices 100, 200, 300, 301, or 400 according to some example embodiments described in detail with reference to FIGS. 1 to 12F, or a semiconductor device in which they are modified and combined.

Figure 18:
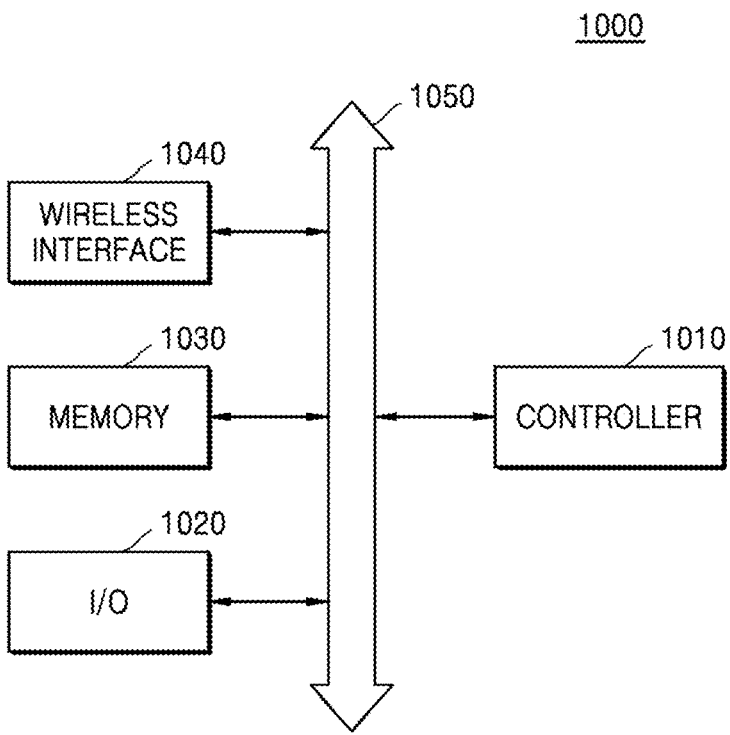
FIG. 18 is a block diagram of an electronic device according to some example embodiments.

FIG. 18 is a block diagram of an electronic device according to some example embodiments.

Referring to FIG. 18, an electronic device 1000 may constitute a wireless communication device or a device capable of transmitting and/or receiving information in a wireless environment. The electronic device 1000 may include a controller 1010, an input/output device I/O 1020, a memory 1030, and a wireless interface 1040, which are connected to one another through a bus 1050.

The controller 1010 may include at least one of a microprocessor, a digital signal processor, or a processing device similar thereto. The input/output device 1020 may include at least one of a keypad, a keyboard, or a display. The memory 1030 may be used to store a command executed by the controller 1010. For example, the memory 1030 may be used to store user data. The electronic device 1000 may use the wireless interface 1040 to transmit/receive data through a wireless communication network. The wireless interface 1040 may include an antenna and/or a wireless transceiver. In some embodiments, the electronic device 1000 may be used in a communication interface protocol of a third-generation communication system, such as code division multiple access (CDMA), global system for mobile communications (GSM), North American digital cellular (NADC), extended-time division multiple access (E-TDMA), and/or wide band code division multiple access (WCDMA), etc. The electronic device 1000 may include any one of the semiconductor devices 100, 200, 300, 301, or 400 according to some example embodiments described in detail with reference to FIGS. 1 to 12F, or a semiconductor device in which they are modified and combined.

As described herein, any devices, systems, modules, units, controllers, circuits, architectures, and/or portions thereof according to any of the example embodiments (including, without limitation, the display DDI 500, the controller 502, the power supply circuit 504, the driver block 506, the memory block 508, the electronic device 520, the MPU 522, the display panel 524, the electronic device 900, the memory 910, the memory controller 920, the host 930, the electronic device 1000, the controller 1010, the input/output device 1020, the memory 1030, the wireless interface 1040, or the like) may include, may be included in, and/or may be implemented by one or more instances of processing circuitry such as hardware including logic circuits; a hardware/software combination such as a processor executing software; or any combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a solid state drive (SSD), storing a program of instructions, and a processor (e.g., CPU) configured to execute the program of instructions to implement the functionality and/or methods performed by some or all of any devices, systems, modules, units, controllers, circuits, architectures, and/or portions thereof according to any of the example embodiments, and/or any portions thereof.

Any of the memories, memory units, memory chips, storages, storage devices, or the like as described herein may be a non-transitory computer readable medium and may store a program of instructions. Any of the memories, memory units, memory chips, storages, storage devices, or the like described herein may be a nonvolatile memory, such as a flash memory, a phase-change random access memory (PRAM), a magneto-resistive RAM (MRAM), a resistive RAM (ReRAM), or a ferro-electric RAM (FRAM), or a volatile memory, such as a static RAM (SRAM), a dynamic RAM (DRAM), or a synchronous DRAM (SDRAM).

A semiconductor device according to some example embodiments is applicable to an IC device due to good electrical capabilities with an ultra-compact structure thereof, and is capable of implementing miniaturization, low power, and high performance.

While the semiconductor device and the electronic device including the same described above have been described with reference to some example embodiments, including the example embodiments illustrated in the drawings, it will be understood by those of ordinary skill in the art that various modifications and equivalent example embodiments are possible therefrom. Therefore, the described and/or illustrated example embodiments should be considered in a descriptive sense rather than a restrictive sense. The scope of the present inventive concepts is not described above, but in the claims, and all the differences in a range equivalent thereto should be interpreted as being included.

The semiconductor device described above has a structure that easily shows a desired threshold voltage while having a miniaturized structure.

The semiconductor device described above is easy to apply to logic design due to its various threshold voltages, and is applicable to various electronic devices.

It should be understood that example embodiments described herein should be considered in a descriptive sense only and not for purposes of limitation. Descriptions of features or aspects within each example embodiment should typically be considered as available for other similar features or aspects in some example embodiments.

While some example embodiments have been described with reference to the figures, it will be understood by those of ordinary skill in the art that various changes in form and details may be made therein without departing from the spirit and scope as defined by the following claims.

What is claimed is:

1. A semiconductor device, comprising:
   a substrate;
   a first channel layer and a second channel layer, the first channel layer and the second channel layer each including a two-dimensional (2D) semiconductor material and being spaced apart from each other in a direction that extends away from the substrate;
   a source electrode and a drain electrode electrically connected to opposite sides of the first channel layer and the second channel layer, respectively;
   a first transition metal oxide layer on the first channel layer and a second transition metal oxide layer on the second channel layer, the first transition metal oxide layer and the second transition metal oxide layer each including a transition metal oxide;
   a first dielectric layer on the first transition metal oxide layer and a second dielectric layer on the second transition metal oxide layer, the first dielectric layer and the second dielectric layer each including a high-k material; and
   a gate electrode on the first dielectric layer and the second dielectric layer,
   wherein the first channel layer and the second channel layer are configured to exhibit different threshold voltages, based on respective materials of the first transition metal oxide layer, the first dielectric layer, the second transition metal oxide layer, and the second dielectric layer.

2. The semiconductor device of claim 1, wherein the first transition metal oxide layer and the first dielectric layer have different oxygen densities.

3. The semiconductor device of claim 1, wherein the first channel layer and the second channel layer each independently comprises a transition metal dichalcogenide (TMD) material.

4. The semiconductor device of claim 3, wherein the TMD material comprises a metal element selected from Mo, W, Nb, V, Ta, Ti, Zr, Hf, Tc, Re, Cu, Ga, In, Sn, Ge, and Pb, and a chalcogen element selected from S, Se, and Te.

5. The semiconductor device of claim 3, wherein the first transition metal oxide layer comprises an oxide of the TMD material included in the first channel layer.

6. The semiconductor device of claim 3, wherein the first channel layer and the first transition metal oxide layer each include an identical transition metal.

7. The semiconductor device of claim 3, wherein the first transition metal oxide layer and the first channel layer are separate portions of a unitary piece of material.

8. The semiconductor device of claim 3, wherein a thickness of the first transition metal oxide layer is equal to or greater than about 1 nm and is less than or equal to about 3 nm.

9. The semiconductor device of claim 1, wherein the semiconductor device is configured to form a first electric dipole moment on an interfacial surface between the first transition metal oxide layer and the first dielectric layer, the semiconductor device is configured to form a second electric dipole moment formed on an interfacial surface between the second transition metal oxide layer and the second dielectric layer, and the first electric dipole moment and the second electric dipole moment have different magnitudes or polarities.

10. The semiconductor device of claim 1, wherein the first channel layer and the second channel layer comprise different TMD materials.

11. The semiconductor device of claim 1, further comprising:

a source structure comprising the source electrode, the source structure connecting the source electrode to the first channel layer; and a drain structure comprising the drain electrode, the drain structure connecting the drain electrode to the first channel layer, wherein the source structure and the drain structure are on the substrate.

12. The semiconductor device of claim 11, wherein each of the source structure and the drain structure comprises a semiconductor region, a silicide film, and a conductive barrier.

13. The semiconductor device of claim 1, wherein a thickness of the first channel layer is less than or equal to about 3 nm and greater than or equal to about 0.01 nm.

14. The semiconductor device of claim 1, wherein a length of the first channel layer in a direction in which the source electrode and the drain electrode are spaced apart from each other is less than or equal to about 5 nm and greater than or equal to about 0.01 nm.

15. The semiconductor device of claim 1, wherein the first channel layer comprises graphene, black phosphorus, amorphous boron nitride, or phosphorene.

16. An electronic device, comprising:

a substrate; and a plurality of semiconductor devices arranged on the substrate, wherein each semiconductor device of the plurality of semiconductor devices includes a first channel layer and a second channel layer, the first channel layer and the second channel layer each including a two-dimensional (2D) semiconductor material and being spaced apart from each other in a direction that extends away from the substrate;

a source electrode and a drain electrode electrically connected to opposite sides of the first channel layer and the second channel layer, respectively;

a first transition metal oxide layer on the first channel layer and a second transition metal oxide layer on the second channel layer, the first transition metal oxide layer and the second transition metal oxide layer each including a transition metal oxide;

a first dielectric layer on the first transition metal oxide layer and a second dielectric layer on the second transition metal oxide layer, the first dielectric layer and the second dielectric layer each including a high-k material; and a gate electrode on the first dielectric layer and the second dielectric layer, and wherein the plurality of semiconductor devices are configured to exhibit different threshold voltages.

17. The electronic device of claim 16, wherein, in the each semiconductor device of the plurality of semiconductor devices, the first channel layer of the each semiconductor device comprises a plurality of channel layers that are spaced apart from each other in the direction that extends away from the substrate, the first transition metal oxide layer and the second transition metal oxide layer of the each semiconductor device comprises a plurality of transition metal oxide layers respectively surrounding the plurality of channel layers, and the first dielectric layer and the second dielectric layer of the each semiconductor device comprises a plurality of dielectric layers respectively surrounding the plurality of transition metal oxide layers.

* * * * *